United States Patent
Li et al.

(10) Patent No.: US 9,953,851 B2
(45) Date of Patent: Apr. 24, 2018

(54) PROCESS SHEET RESISTANCE UNIFORMITY IMPROVEMENT USING MULTIPLE MELT LASER EXPOSURES

(71) Applicant: Applied Materials, Inc., Santa Clara, CA (US)

(72) Inventors: Jiping Li, Palo Alto, CA (US); Aaron Muir Hunter, Santa Cruz, CA (US); Bruce E. Adams, Portland, OR (US); Kim Vellore, San Jose, CA (US); Samuel C. Howells, Portland, OR (US); Stephen Moffatt, St. Brelade (JE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/207,226

(22) Filed: Jul. 11, 2016

(65) Prior Publication Data
US 2017/0040194 A1    Feb. 9, 2017

Related U.S. Application Data

(62) Division of application No. 14/159,228, filed on Jan. 20, 2014, now Pat. No. 9,390,926.
(Continued)

(51) Int. Cl.
| | |
|---|---|
| *H01L 21/00* | (2006.01) |
| *H01L 21/20* | (2006.01) |
| *H01L 21/36* | (2006.01) |
| *H01L 21/26* | (2006.01) |
| *H01L 21/42* | (2006.01) |
| *H01L 21/44* | (2006.01) |
| *H01L 21/67* | (2006.01) |
| *H01L 21/268* | (2006.01) |
| *B23K 26/00* | (2014.01) |
| *B23K 26/03* | (2006.01) |
| *B23K 26/0622* | (2014.01) |
| *B23K 26/066* | (2014.01) |

(Continued)

(52) U.S. Cl.
CPC ...... *H01L 21/67115* (2013.01); *B23K 26/009* (2013.01); *B23K 26/0066* (2013.01); *B23K 26/034* (2013.01); *B23K 26/066* (2015.10); *B23K 26/0622* (2015.10); *H01L 21/268* (2013.01); *H01L 21/324* (2013.01); *B23K 2201/40* (2013.01)

(58) Field of Classification Search
None
See application file for complete search history.

(56) References Cited

U.S. PATENT DOCUMENTS 5,373,519 A * 12/1994 Siono ................ G02B 5/1861
                                                  359/572
7,397,831 B2    7/2008 Hongo et al.
(Continued)

OTHER PUBLICATIONS

Office Action for U.S. Appl. No. 14/159,228 (APPM/020447US) dated Sep. 25, 2015.

*Primary Examiner* — Calvin Choi
(74) *Attorney, Agent, or Firm* — Patterson + Sheridan LLP

(57) ABSTRACT

Embodiments described herein relate to apparatus and methods of thermal processing. More specifically, apparatus and methods described herein relate to laser thermal treatment of semiconductor substrates by increasing the uniformity of energy distribution in an image at a surface of a substrate.

18 Claims, 16 Drawing Sheets

Related U.S. Application Data

(60) Provisional application No. 61/776,380, filed on Mar. 11, 2013.

(51) Int. Cl.
*H01L 21/324* (2006.01)
*B23K 101/40* (2006.01)

(56) References Cited

U.S. PATENT DOCUMENTS

| | | |
|---|---|---|
| 7,800,081 B2 | 9/2010 | Moffatt et al. |
| 8,148,663 B2 | 4/2012 | Adams et al. |
| 8,569,187 B2 | 10/2013 | Moffatt et al. |
| 8,691,598 B1 | 4/2014 | McWhirter et al. |
| 2003/0098959 A1* | 5/2003 | Hagiwara ............ G03F 7/70041 355/69 |
| 2004/0043310 A1 | 3/2004 | Takeishi et al. |
| 2011/0317136 A1* | 12/2011 | Ryzhikov .................. G03F 1/84 355/30 |
| 2012/0325784 A1 | 12/2012 | Moffatt et al. |
| 2012/0329178 A1* | 12/2012 | Moffatt .................. B23K 26/03 438/5 |
| 2014/0084308 A1* | 3/2014 | Wong .................... H01L 25/167 257/84 |

* cited by examiner

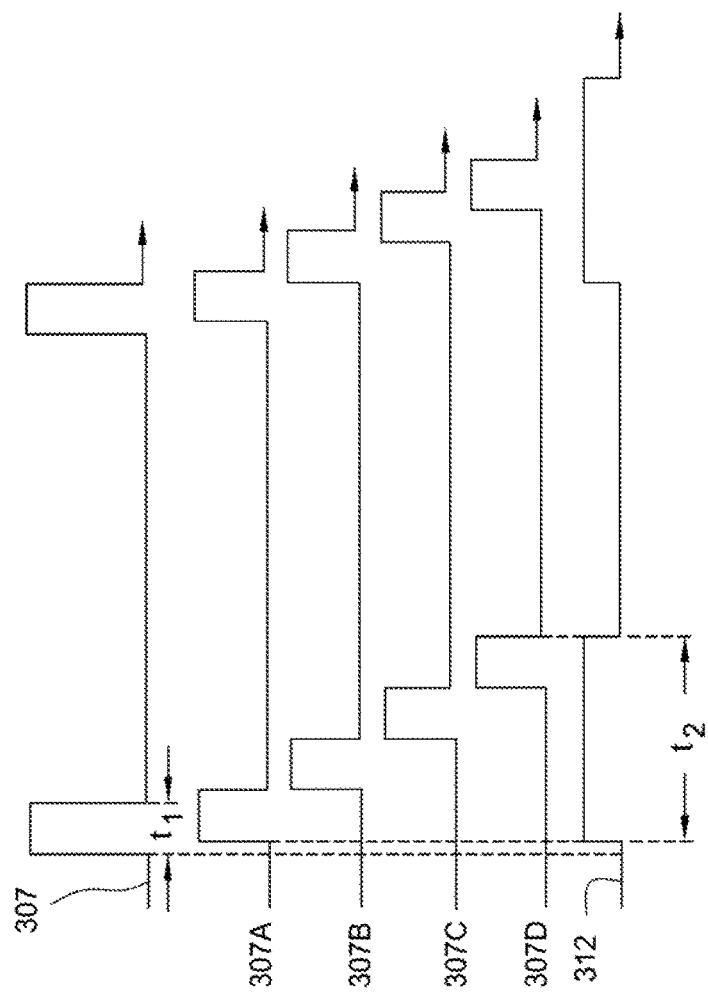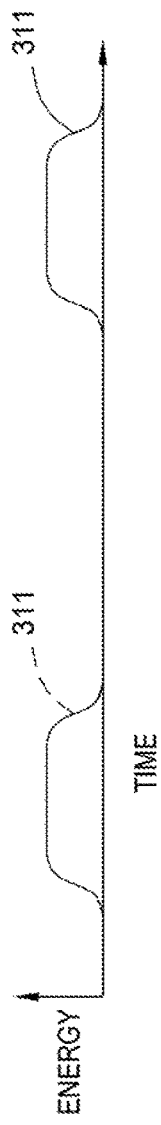

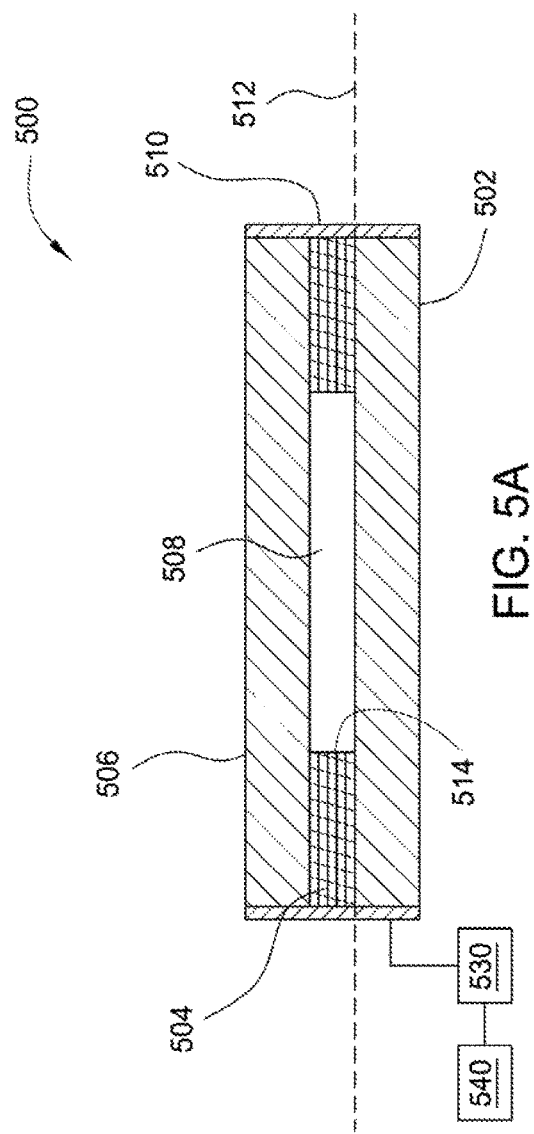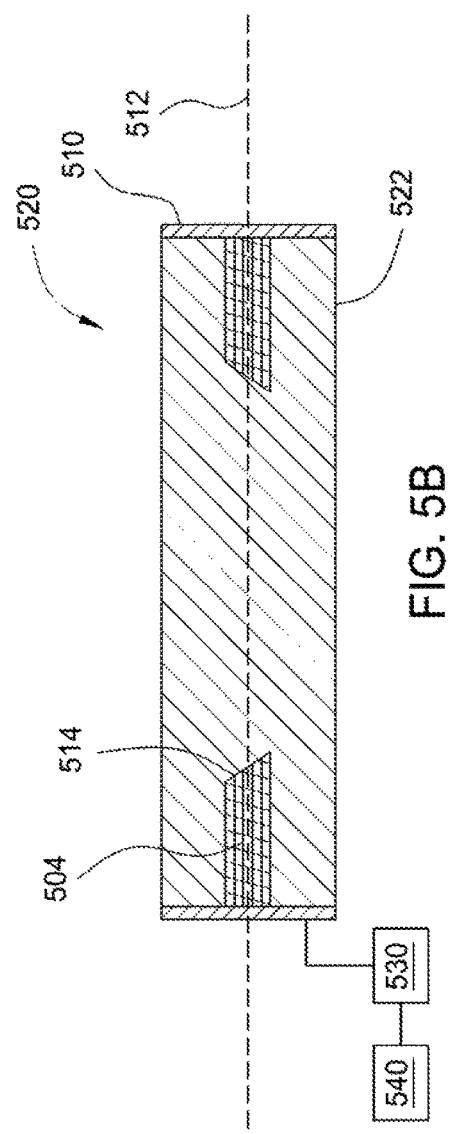

PROCESS SHEET RESISTANCE UNIFORMITY IMPROVEMENT USING MULTIPLE MELT LASER EXPOSURES

CROSS-REFERENCE TO RELATED APPLICATIONS

This application is a divisional of U.S. patent application Ser. No. 14/159,228, filed Jan. 20, 2014, which claims benefit of U.S. Provisional Patent Application No. 61/776,380, filed Mar. 11, 2013, both of which are herein incorporated by reference in their entirety.

BACKGROUND

Field

Embodiments described herein relate to apparatus and methods of thermal processing. More specifically, apparatus and methods described herein relate to laser thermal treatment of semiconductor substrates.

Description of the Related Art

Thermal processing is commonly practiced in the semiconductor industry. Semiconductor substrates are subjected to thermal processing in the context of many transformations, including doping, activation, and annealing of gate source, drain, and channel structures, siliciding, crystallization, oxidation, and the like. Over the years, techniques of thermal processing have progressed from simple furnace baking, to various forms of increasingly rapid thermal processing such as RTP, spike annealing, and laser annealing.

Conventional laser annealing processes use laser emitters that may be semiconductor or solid state lasers with optics that focus, defocus, or variously image the laser light into a desired shape. A common approach is to image the laser light into a line or thin rectangle image. The laser light is scanned across a substrate (or the substrate moved beneath the laser light) to process the entire surface of the substrate.

As device geometry continues to decline, semiconductor manufacturing processes such as thermal processing are challenged to develop increased precision. In many instances, pulsed laser processes are being explored to reduce overall thermal budget and reduce depth and duration of energy exposure at the substrate. Challenges remain, however, in creating laser pulses having a temporal shape that affords the desired processing performance, with the uniformity needed for uniform processing across the surface of a substrate. Thus, there is a continuing need for new apparatus and methods for thermal processing of semiconductor substrates.

SUMMARY

Embodiments described herein relate to apparatus and methods of thermal processing. More specifically, apparatus and methods described herein relate to laser thermal treatment of semiconductor substrates by increasing the uniformity of energy distribution in an image at a surface of a substrate.

In one embodiment, a method of thermally processing a substrate is provided. The method comprises positioning a substrate at a first position, identifying a treatment zone of the substrate, and directing a first pulse of annealing energy through an aperture at a second position to the treatment zone. The substrate is moved to a third position different from the first position and the aperture is moved to a fourth position different from the second position. A second pulse of annealing energy is directed through the aperture at the fourth position to the treatment zone.

In another embodiment, a thermal processing apparatus is provided. The apparatus comprises a laser source and an aperture member disposed within a focal plane of the energy emitted from the laser source. The aperture member comprises a first member which is substantially transparent to the energy emitted from the laser source and a second member which is substantially non-transmissive to the energy emitted from the laser source. The second member is disposed within the first member substantially at the focal plane and a third member is coupled to the first member and the second member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 3B and 3C are graphs showing pulse timing and pulse energy profile using the pulse shaper of FIG. 3A.

FIG. 5A illustrates a side view of an aperture member according to one embodiment.

FIG. 5B illustrates a side view of an aperture member according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
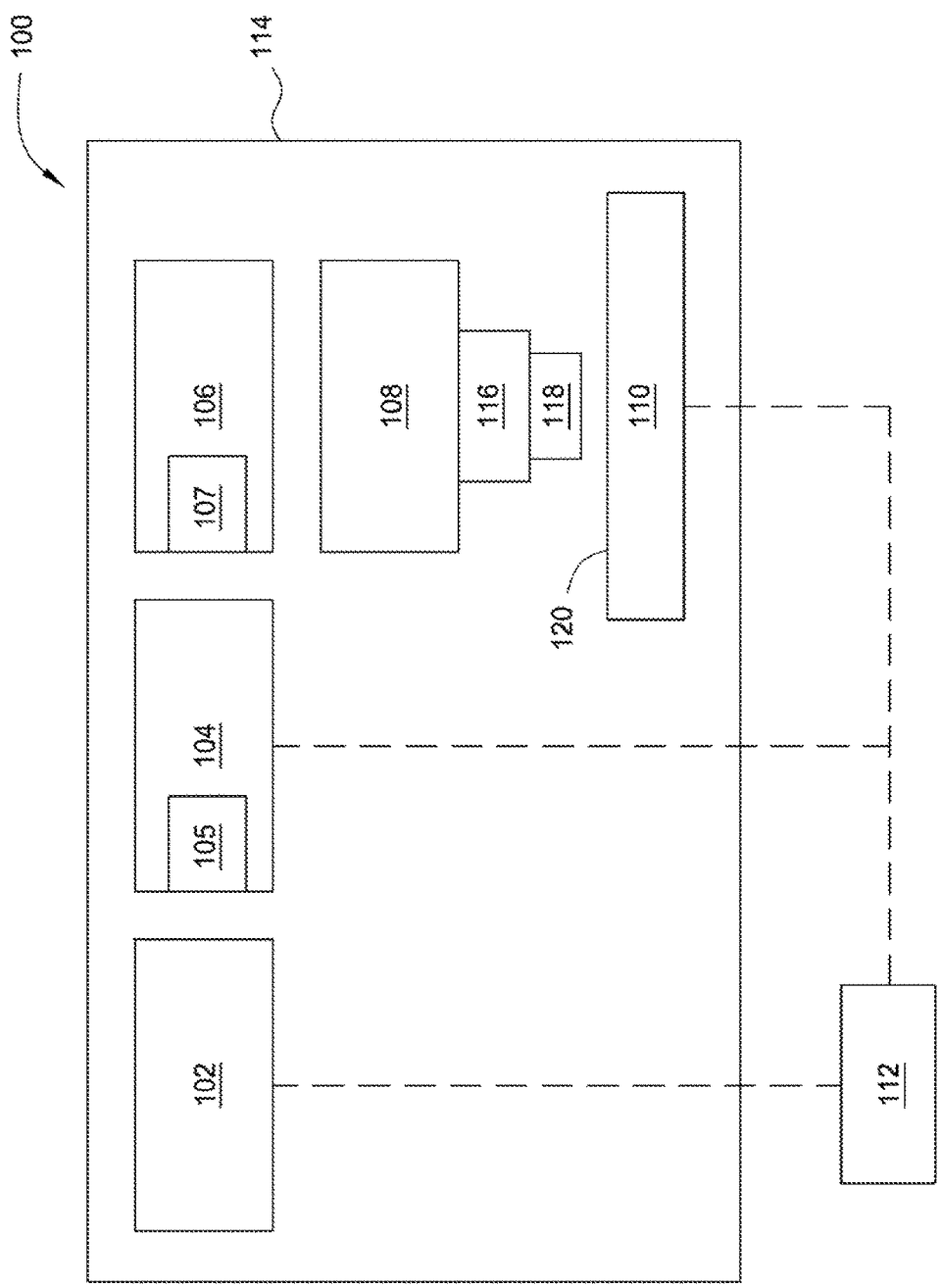
FIG. 1 is a schematic diagram of a thermal processing apparatus according to one embodiment.

FIG. 1 is a plan view of a system 100 for laser processing of substrates. The system 100 comprises an energy module 102 that has a plurality of pulsed laser sources producing a plurality of laser pulses, a pulse control module 104 that combines individual laser pulses into combination laser pulses, and that controls intensity, frequency characteristics, and polarity characteristics of the combination laser pulses, a pulse shaping module 106 that adjusts the temporal profile of the pulses of the combined laser pulses, a homogenizer 108 that adjusts the spatial energy distribution of the pulses, overlapping the combination laser pulses into a single uniform energy field, an aperture member 116 that removes residual edge non-uniformity from the energy field, and an alignment module 118 that allows precision alignment of the laser energy field with a substrate disposed on a substrate support 110. A controller 112 is coupled to the energy module 102 to control production of the laser pulses, the pulse control module 104 to control pulse characteristics, and the substrate support 110 to control movement of the substrate with respect to the energy field. An enclosure 114 typically encloses the operative components of the system 100.

The lasers may be any type of laser capable of forming short pulses, for example duration less than about 100 nsec., of high power laser radiation. Typically, high modality lasers having over 500 spatial modes with $M^2$ greater than about 30 are used. Solid state lasers such as Nd:YAG, Nd:glass, titanium-sapphire, or other rare earth doped crystal lasers are frequently used, but gas lasers such as excimer lasers, for example $XeCl_2$, ArF, or KrF lasers, may be used. The lasers may be switched, for example by q-switching (passive or active), gain switching, or mode locking. A Pockels cell may also be used proximate the output of a laser to form pulses by interrupting a beam emitted by the laser. In general, lasers usable for pulsed laser processing are capable of producing pulses of laser radiation having energy content between about 100 mJ and about 10 J with duration between about 1 nsec and about 100 μsec, typically about 1 J in about 8 nsec. The lasers may have wavelength between about 200 nm and about 2,000 nm, such as between about 400 nm and about 1,000 nm, for example about 532 nm. In one embodiment, the lasers are q-switched frequency-doubled Nd:YAG lasers. The lasers may all operate at the same wavelength, or one or more of the lasers may operate at different wavelengths from the other lasers in the energy module 102. The lasers may be amplified to develop the power levels desired. In most cases, the amplification medium will be the same or similar composition to the lasing medium. Each individual laser pulse is usually amplified by itself, but in some embodiments, all laser pulses may be amplified after combining.

A typical laser pulse delivered to a substrate is a combination of multiple laser pulses. The multiple pulses are generated at controlled times and in controlled relationship to each other such that, when combined, a single pulse of laser radiation results that has a controlled temporal and spatial energy profile, with a controlled energy rise, duration, and decay, and a controlled spatial distribution of energy non-uniformity. The controller 112 may have a pulse generator, for example an electronic timer coupled to a voltage source, that is coupled to each laser, for example each switch of each laser, to control generation of pulses from each laser.

Figure 2A:
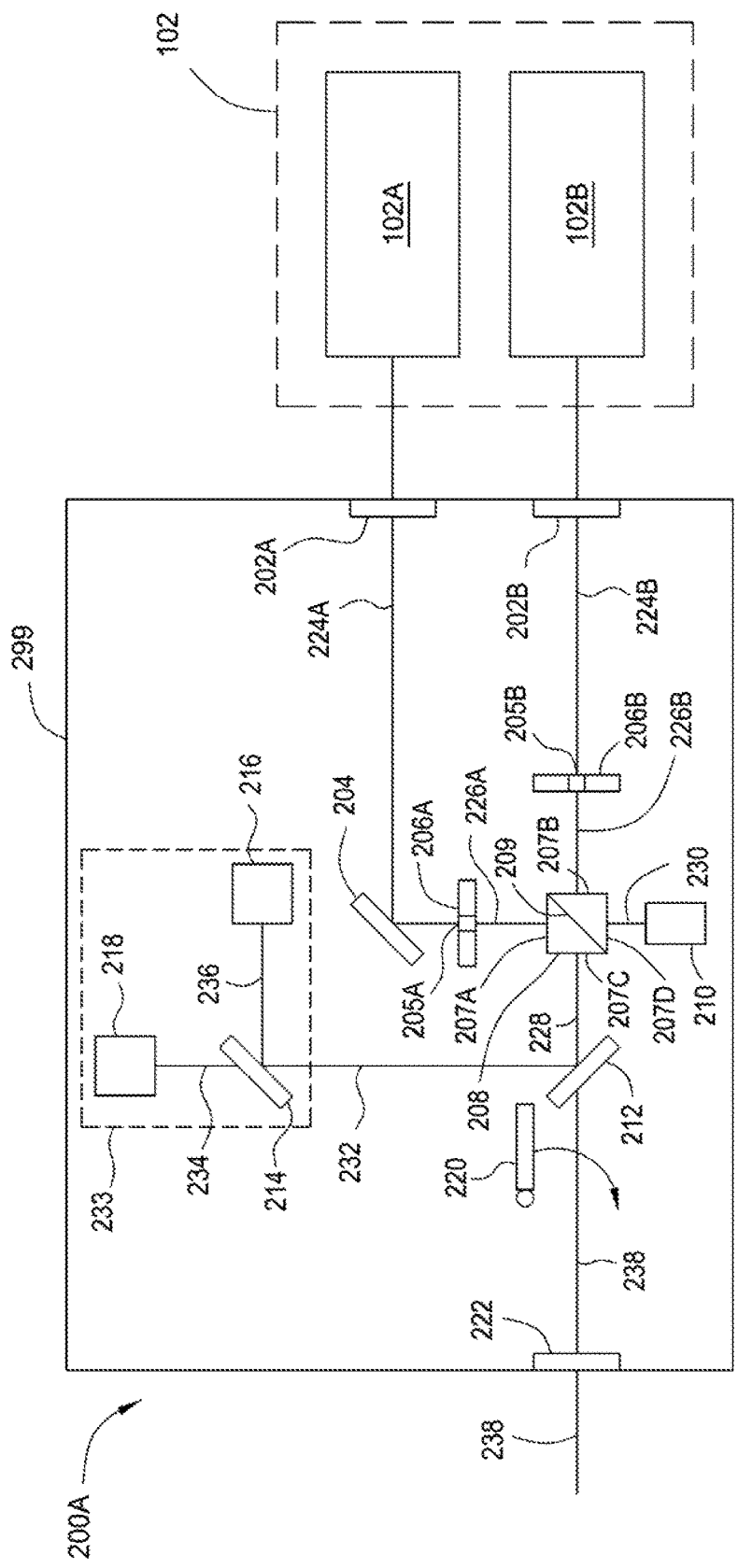
FIGS. 2A and 2B are plan views of pulse controllers according to two embodiments.

The plurality of lasers are arranged so that each laser produces pulses that emerge into the pulse control module 104, which may have one or more pulse controllers 105. FIG. 2A is a plan view of a pulse controller 200A according to one embodiment. The one or more pulse controllers 105 described above in connection with FIG. 1 may each be a pulse controller such as the pulse controller 200A shown in FIG. 2A. Using optics contained in an enclosure 299 to prevent light pollution, the pulse controller 200A combines a first input pulse 224A received from the energy module 102 and a second input pulse 224B received from the energy module 102 into one output laser pulse 238. The two input laser pulses 224A/B enter the pulse controller 200A through input lenses 202A and 202B disposed in openings of the enclosure 299. In the embodiment of FIG. 2A, the two input lenses 202A/B are aligned along one surface of the enclosure 299, with the laser pulses 224/A/B entering the enclosure 299 in a substantially parallel orientation.

The two input pulses 224A/B are directed to a combining optic 208 that combines the two pulses into one pulse 238. The combining optic has a first entry surface 207A oriented perpendicular to the entry path of the incident pulse 226A and a second entry surface 207B oriented perpendicular to the entry path of the incident pulse 226B to avoid any refraction of the input pulses 226A/B upon entering the combining optic 208. The combining optic 208 of FIG. 2A is a crystal that has a selecting surface 209 oriented such that first and second incident pulses 226A/B each strike the selecting surface 209 at an angle of approximately 45°. The selecting surface 209 interacts with light selectively depending on the properties of the light. The selecting surface 209 of the combining optic 208 may reflect the first incident pulse 226A and transmit the second incident pulse to create the combined pulse 228. To facilitate combination of the pulses, each of the incident pulses 226A/B may be tailored to interact with the selecting surface 209 in a particular way.

In one embodiment, the selecting surface 209 is a polarizing surface. The polarizing surface may have a linear axis of polarity, such that polarizing the incident pulse 226B parallel to the axis of the polarizing surface allows the incident pulse 226B to be transmitted by the polarizing surface, and polarizing the incident pulse 226A perpendicular to the axis of the polarizing surface allows the incident pulse 226A to be reflected by the polarizing surface. Aligning the two incident pulses 226A/B to the same spot on the polarizing surface creates the combined pulse 228 emerging from a first exit surface 207C of the combining optic 208 perpendicular to the surface 207C to avoid any refraction of the combined pulse 228. Alternately, the selecting surface 209 may be a circular polarizer, with the incident pulse 226A circularly polarized opposite the sense of the circular polarizer for reflection, and the incident pulse 226B circularly polarized in the same sense as the circular polarizer for transmission. In another embodiment, the incident pulses 226A/B may have different wavelengths, and the selecting surface 209 may be configured to reflect light of one wavelength and to transmit light of another wavelength, such as with a dielectric mirror.

In a polarization embodiment, polarization of the incident pulses 226A/B is accomplished using polarizing filters 206A/B. The polarizing filters 206A/B polarize the input pulses 224A/B to be selectively reflected or transmitted by the selecting surface 209 of the combining optic 208. The polarizing filters 206A/B may be wave plates, for example half-wave plates or quarter-wave plates, with polarizing axes oriented orthogonal to each other to produce the orthogonally polarized light for selective reflecting and transmission at the selecting surface 209. The axis of each polarizing filter 206A/B may be independently adjusted, for example with rotational actuators 205A/B, to precisely align the polarization of the incident pulses 226A/B with the polarization axis of the selecting surface 209, or to provide a desired angle of deviation between the polarization axis of an input pulse 226A/B and the polarization axis of the selecting surface 209.

Adjusting the polarization axis of the incident pulses 226A/B controls intensity of the combined pulse 228, because a polarizing filter transmits incident light according to Malus' Law, which holds that the intensity of light transmitted by a polarizing filter is proportional to the incident intensity and the square of the cosine of the angle between polarization axis of the filter and polarization axis of the incident light. Thus, rotating the polarizing filter 206A so that the polarization axis of the polarizing filter 206A deviates from an orientation perpendicular to the polarization axis of the selecting surface 209 results in a portion of the incident pulse 226A being transmitted through the selecting surface 209. Likewise, rotating the polarizing filter 206B so that its polarization axis deviates from an orientation parallel to the axis of the selecting surface 209 results in a portion of the incident pulse 226B being reflected from the selecting surface 209. This "non-selected" light from each of the incident pulses 226A/B is combined into a rejected pulse 230 that exits the combining optic 208 through a second exit surface 207D into a pulse dump 210. In this way, each of the polarizing filters acts as a dimmer switch to attenuate the intensity of pulses passing through the polarizing filters.

It should be noted that the two pulses 226A/B that are to be combined by the combining optic 208 are directed toward opposite sides of the selecting surface 209 for selective reflection and transmission. Thus, the first input pulse 202A is directed along a path that brings the first input pulse 202A toward a reflecting side of the selecting surface 209 by a reflector 204, while the second input pulse 202B is directed toward transmitting side of the selecting surface 209. Any combination of reflectors may naturally be used to steer light along a desired path within the pulse control module 104.

The combined pulse 228 interacts with a first splitter 212 that splits the combined pulse 228 into the output pulse 238 and a sampled pulse 232. The splitter 212 may be a partial mirror or a pulse splitter. The sampled pulse 232 is directed to a diagnostic module 233 that analyzes properties of the sampled pulse 232 to represent properties of the output pulse 238. In the embodiment of FIG. 2A, the diagnostic module 233 has two detectors 216 and 218 that detect the temporal shape of a pulse and the total energy content of a pulse, respectively. A second splitter 214 forms a first pulse 236 and a second pulse 234 for input to the respective detectors. The temporal shape detector 216 is an intensity monitor that signals intensity of light incident on the monitor in very short time scales. Light pulses incident on the temporal shape detector may have total duration from 1 picosecond (psec) to 100 nsec, so the temporal shape detector, which may be a photodiode or photodiode array, renders intensity signals at useful subdivisions of these time scales. The energy detector 218 may be a pyroelectric device, such as a thermocouple, that converts incident electromagnetic radiation to voltage that can be measured to indicate the energy content of the energy sample pulse 234. Because the first and second splitters 212 and 214 sample a known fraction of incident light based on the transmitting fraction of the first and second splitters 212 and 214, the energy content of the output pulse 238 may be calculated from the energy content of the energy sample pulse 234.

Signals from the diagnostic module 233 may be routed to the controller 112 of FIG. 1, which may adjust the laser operation or the pulse control operation to achieve desired results. The controller 112 may adjust an electronic timer coupled to an active q-switch of each laser to control pulse timing in response to results from the temporal shape detector 216. Cycling the active q-switch faster makes shorter pulses, and vice versa. The controller 112 may be coupled to the rotational actuators 205A/B to adjust the intensity of the output pulse 238, based on results from the energy detector 218, by adjusting the polarization angle of light passing through the polarizing filters 206A/B. In this way, the duration and energy content of the output pulse 238 may be independently controlled. The controller 112 may also be configured to adjust power input to each laser.

The output pulse 238 may be interrupted by a shutter 220, if desired. The shutter 220 (shown schematically in FIGS. 2A and 2B) may be provided as a safety device in the event the laser energy emerging from the pulse control module 104 is to be interrupted to make an adjustment to a component subsequent to the pulse control module 104. The output pulse 238 exits the pulse control module 104 through an output lens 222.

The output pulse 238 is a combination of the two incident pulses 226A/B. As such the output pulse 238 has properties that represent a combination of the properties of the two incident pulses 226A/B. In the polarization example described above, the output pulse 238 may have an elliptical polarization representing the combination of two orthogonally polarized incident pulses 226A/B having different intensities according to the degree of transmission/reflection of each of the incident pulses 226A/B at the selecting surface 209. In an example using incident wavelength at the selecting surface 209 to combine two pulses, the output pulse 238 will have a wavelength representing the combined wavelength of the two incident pulses 226A/B according to their respective intensities.

For example, a 1,064 nm reflecting dielectric mirror may be disposed at the selecting surface 209 of the combining optic 208. The incident pulse 226A may have wavelength of approximately 1,064 nm with intensity A for reflecting from the selecting surface 209, and the incident pulse 226B may have a wavelength of 532 nm with intensity B for transmitting through the selecting surface 209. The combined pulse 228 will be a co-propagating bi-pulse of two photons having the wavelengths and intensities of the incident pulses 226A/B, with total energy content that is the sum of the two pulse energies.

Figure 2B:
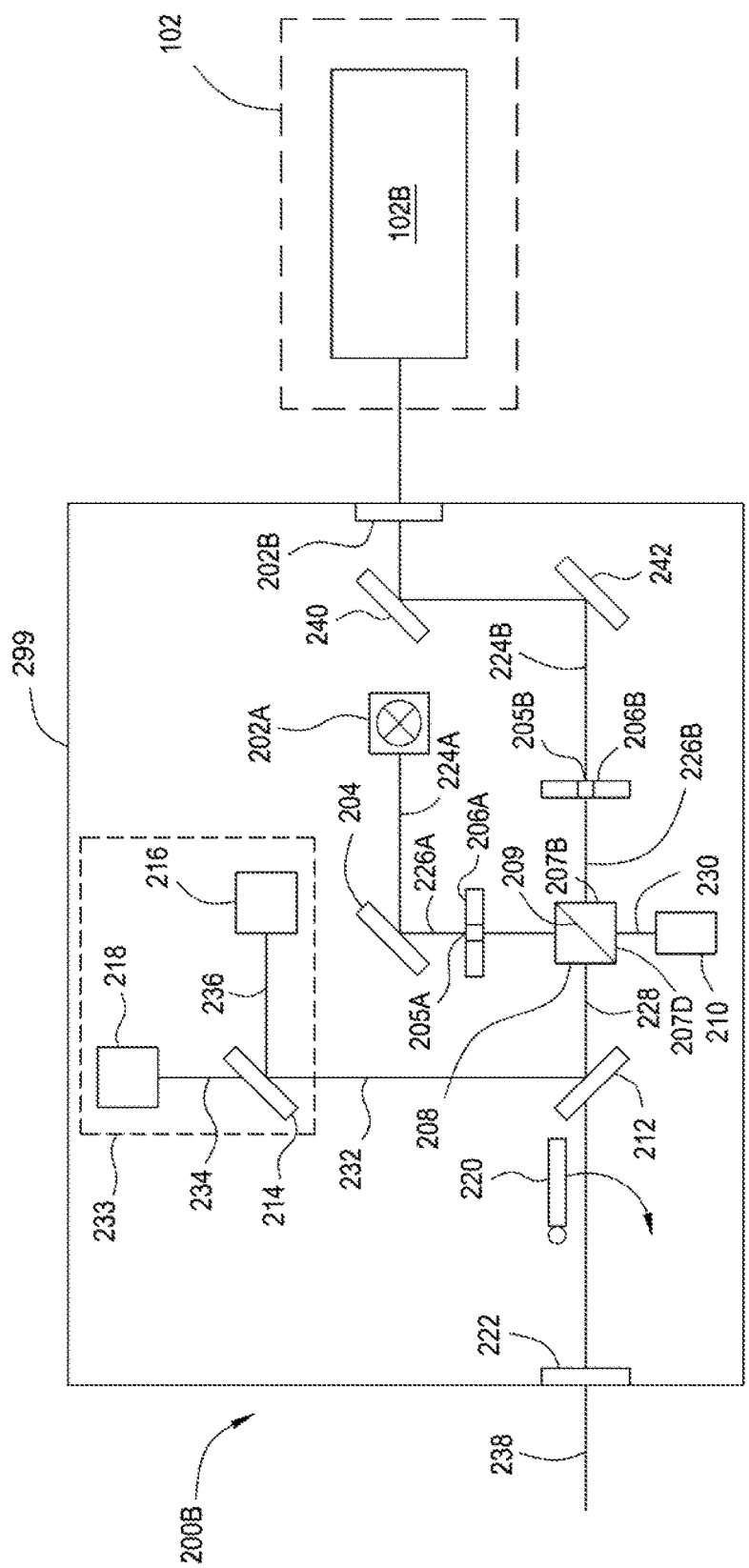

FIG. 2B is a plan view of a pulse control module 200B according to another embodiment. The one or more pulse controllers 105 described above in connection with FIG. 1 may each be a pulse controller such as the pulse controller 200B or the pulse controller 200A. The pulse controller 200B is the same as the pulse controller 200A, with the following differences. In the embodiment of FIG. 2B, the input lens 202A is not located adjacent to the input lens 202B on the same surface of the enclosure 299. In FIG. 2B, the input lens 202A is located on a surface of the enclosure 299 that is substantially orthogonal to the surface on which the input lens 202B is located, in this embodiment on an adjacent wall of a rectangular enclosure. Thus, the first input pulse 224A enters through the first input lens 202A (in a direction into the page of FIG. 2B) and is diverted into the plane of FIG. 2B by a reflector that is obscured by the first input lens 202a in the view of FIG. 2B. Reflectors 240 and 242 position the input pulse 224B for entry into the polarizer 206B, illustrating the use of reflectors to position pulses on any desired path. Steering pulses around the pulse control module 104 may be helpful in cases where locating the laser energy sources is space constrained.

Figure 2C:
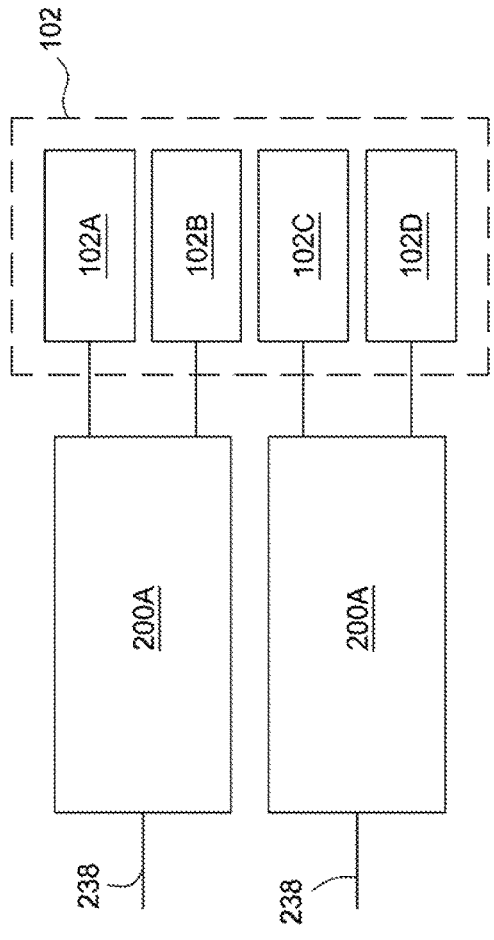
FIGS. 2C-2E are schematic views of different configurations of pulse controllers and energy sources according to three embodiments.
Figure 2D:
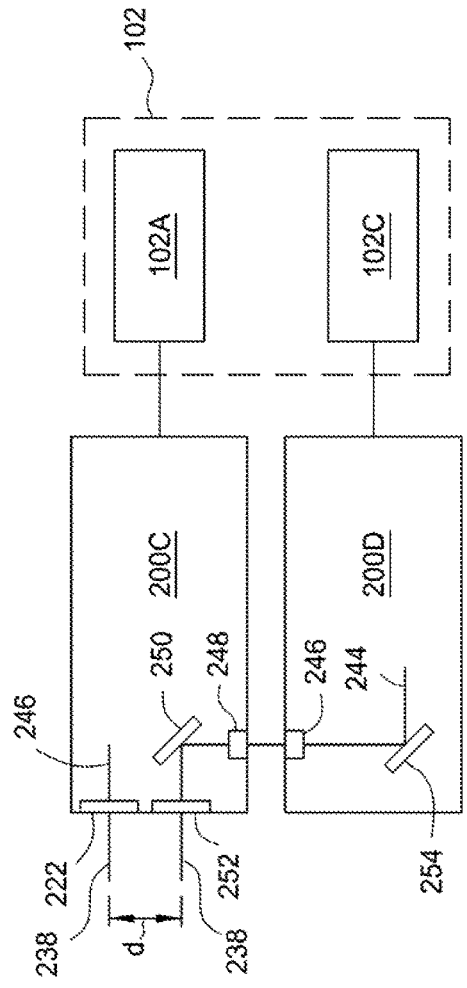

FIGS. 2C and 2D are schematic views showing embodiments that have multiple pulse controllers 200A/B. In the embodiment of FIG. 2C, two pulse controllers of the configuration of the pulse controller 200A of FIG. 2A are aligned with four laser sources 102A-D to form two combined pulses 238. In the embodiment of FIG. 2D, two combined pulses 238 are formed having a desired distance "d" between them. Two pulse controllers 200C/D accept input pulses from two energy sources 102A and 102C along the plane of FIG. 2D and perpendicular to the plane of FIG. 2D from two energy sources not visible in the view of FIG. 2D. The two pulse controllers 200C/D are the same as the pulse controller 200B, with the following differences. The pulse controller 200D is configured to direct an output pulse 244 through an output lens 246 using an output reflector 254. The output lens 246 directs the output pulse 244 into an input lens 248 of the pulse controller 200C to a reflector 250 and an output lens 252 of the pulse controller 200C. In this way, the two output pulses 238 may be positioned any desired distance "d" from each other on exiting the pulse control module 104 (FIG. 1). For most embodiments, the distance "d" will be between about 1 mm and about 1,000 mm, such as less than 50 mm, for example about 35 mm. As shown in FIG. 2D, the distance "d" may be less than a dimension of the pulse controller 200C.

Figure 2E:
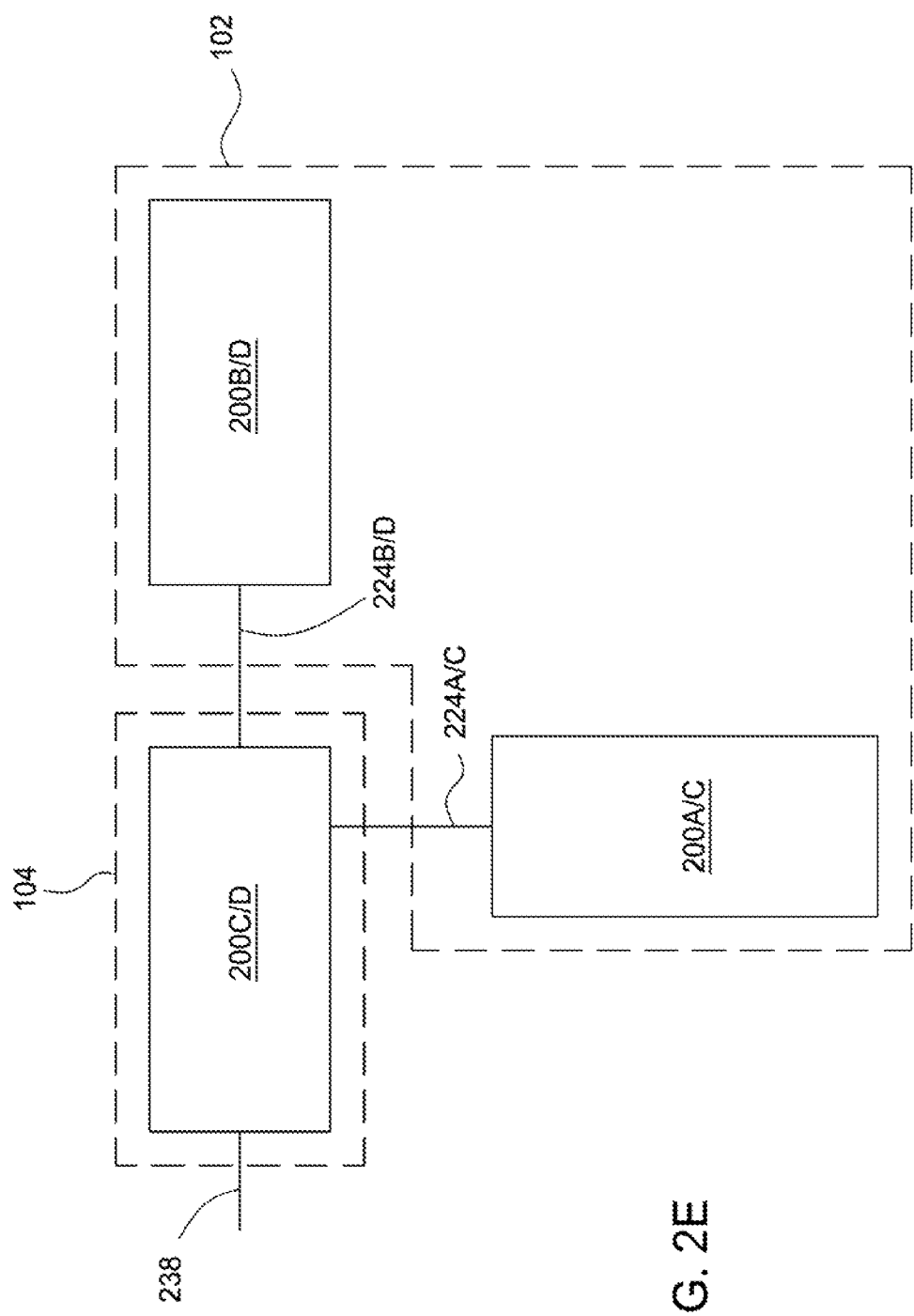

FIG. 2E is a schematic top view of the apparatus of FIG. 2D, showing an embodiment wherein the energy sources 102 are configured in a right-angle relationship. The energy sources 102B/D visible in FIG. 2E were not visible in the view of FIG. 2D. The energy sources 102A/B produce input pulses 224A/B for processing in pulse controller 200C, while the energy sources 102C/D produce input pulses 224C/D for processing in pulse controller 200D. The output pulses of the pulse controllers 200C/D are arranged as shown in FIG. 2D separated by a desired distance "d", which is not visible in the view of FIG. 2E. It should be noted that the pulse controllers 200A-200D may be pulse combiners in some embodiments.

Figure 3A:
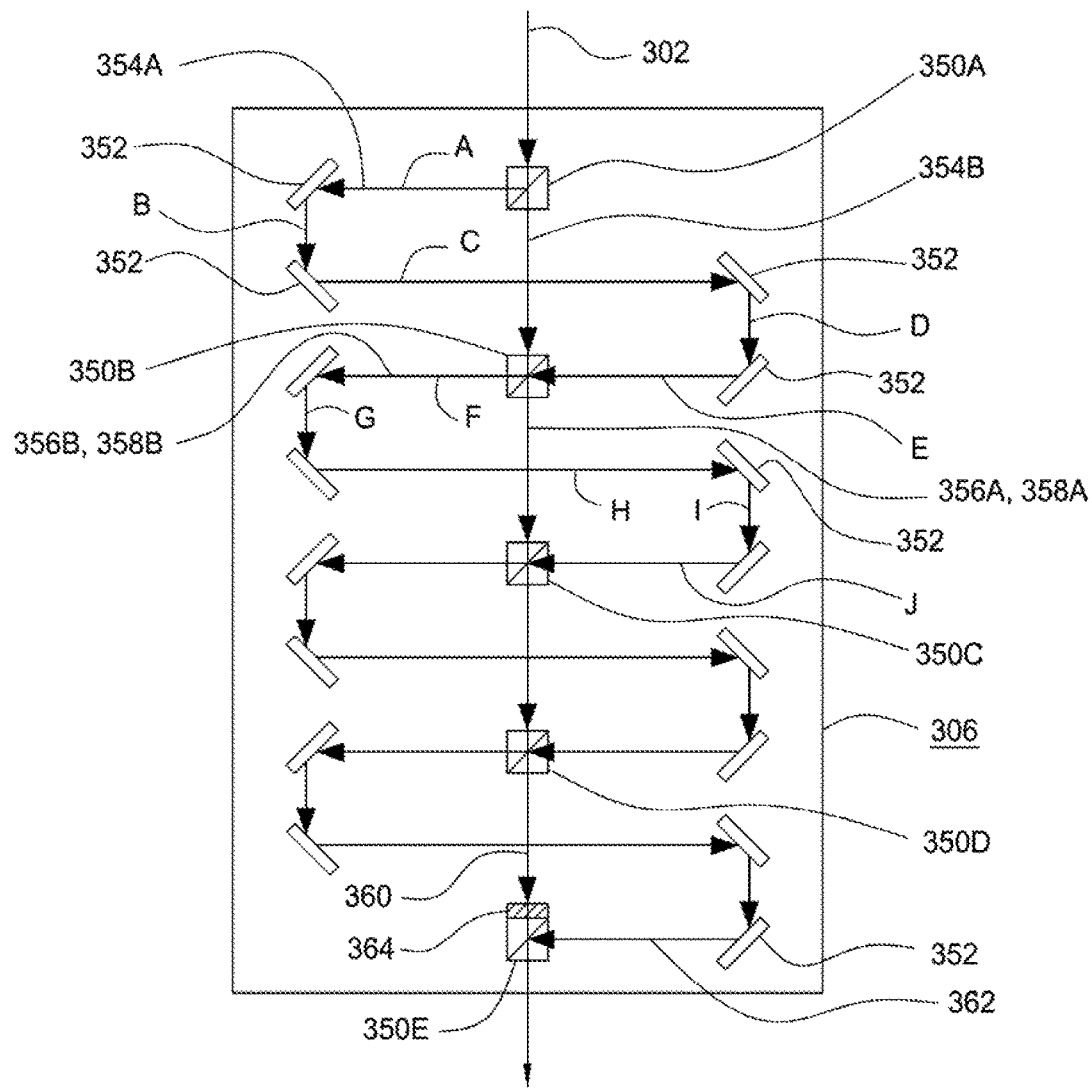
FIG. 3A is a schematic view of a pulse shaper according to one embodiment.

One or more pulses exit the pulse control module 104 and enter the pulse shaping module 106, which has one or more pulse shapers 107, as shown schematically in FIG. 1. FIG. 3A is a schematic illustration of one embodiment of a pulse shaper 306. The one or more pulse shapers 107 of the pulse shaping module 106 may each be a pulse shaper such as the pulse shaper 306. The pulse shaper of FIG. 3A may comprise a plurality of mirrors 352 (e.g., 16 mirrors are shown) and a plurality of splitters (e.g., reference numerals 350A-350E) that are used to delay portions of a laser energy pulse to provide a composite pulse that has a desirable characteristics (e.g., pulse width and profile). In one example, a laser energy pulse 302 entering the pulse shaping module may be spatially coherent. A pulse of laser energy is split into two components, or sub-pulses 354A, 354B, after passing through the first splitter 350A. Neglecting losses in the various optical components, depending on the transmission to reflection ratio in the first splitter 350A, a percentage of the laser energy (i.e., X %) is transferred to the second splitter 350B in the first sub-pulse 354A, and a percentage of the energy (i.e., 1−X %) of the second sub-pulse 354B follows a path A-E (i.e., segments A-E) as it is reflected by multiple mirrors 352 before it strikes the second splitter 350B.

In one example, the transmission to reflection ratio of the first splitter 350A is selected so that 70% of the pulse's energy is reflected and 30% is transmitted through the splitter. In another example the transmission to reflection ratio of the first splitter 350A is selected so that 50% of the pulse's energy is reflected and 50% is transmitted through the splitter. The length of the path A-E, or sum of the lengths of the segments A-E (i.e., total length=A+B+C+D+E as illustrated in FIG. 3A), will control the delay between sub-pulse 354A and sub-pulse 354B. In general by adjusting the difference in path length between the first sub-pulse 354A and the second sub-pulse 354B a delay of about 3.1 nanoseconds (ns) per meter of path length difference can be realized.

The energy delivered to the second pulse 350B in the first sub-pulse 354A is split into a second sub-pulse 356A that is directly transmitted to the third splitter 350C and a second sub-pulse 356B that follows the path F-J before it strikes the third splitter 350C. The energy delivered in the second sub-pulse 354B is also split into a third sub-pulse 358A that is directly transmitted to the third splitter 350C and a third sub-pulse 358B that follows the path F-J before it strikes the third splitter 350C. This process of splitting and delaying each of the sub-pulses continues as each of the sub-pulses strikes subsequent splitters (i.e., reference numerals 350D-E) and mirrors 352 until they are all recombined in the final splitter 350E that is adapted to primarily deliver energy to the next component in the thermal processing apparatus 100. The final splitter 350E may be a polarizing splitter that adjusts the polarization of the energy in the sub-pulses received from the delaying regions or from the prior splitter so that it can be directed in a desired direction.

In one embodiment, a waveplate 364 is positioned before a polarizing type of final splitter 350E so that its polarization can be rotated for the sub-pulses following path 360. Without the adjustment to the polarization, a portion of the energy will be reflected by the final pulse splitter and not get recombined with the other branch. In one example, all energy in the pulse shaper 306 is S-polarized, and thus the non-polarizing cube splitters divide incoming pulses, but the final splitter, which is a polarizing cube, combines the energy that it receives. The energy in the sub-pulses following path 360 will have its polarization rotated to P, which passes straight through the polarizing pulse splitter, while the other sub pulses following path 362 are S-polarized and thus are reflected to form a combined pulse.

In one embodiment, the final pulse splitter 350E comprises a non-polarizing splitter and a mirror that is positioned to combine the energy received from the delaying regions or from the prior splitter. In this case, the splitter will project part of the energy towards a desired point, transmit another part of the energy received towards the desired point, and the mirror will direct the remaining amount of energy transmitted through the splitter to the same desired point. One will note that the number of times the pulse is split and delayed may be varied by adding pulse splitting type components and mirrors in the configuration as shown herein to achieve a desirable pulse duration and a desirable pulse profile. While FIG. 3A illustrates a pulse shaper design that utilizes four pulse delaying regions with splitters and mirrors, this configuration is not intended to be limiting as to the scope of the invention.

FIG. 3B illustrates an example of an energy versus time graph of various sub-pulses that have passed through a two pulse delaying region pulse shaper, which is similar to the first two pulse delaying regions of the pulse shaper illustrated in FIG. 3A. As shown in FIG. 3B, the pulse train pattern 307 delivered to the input of the pulse shaper (FIG. 3A) has an individual pulse duration equal to $t_1$. In this case, pattern 307A is the first pulse train, pattern 307B is the second pulse train, pattern 307C is the third pulse train, and pattern 307D is the fourth pulse train that exits the pulse shaper 306 of FIG. 3A. In general, the duration of each of the sub-pulses will be about $t_1$, since this property of the pulses of the original pattern 307 will remain relatively unchanged due to the pulse shaping process illustrated in FIG. 3A. Referring to FIG. 3B, it follows that the pulses of pattern 307A traveled the shortest distance and the pulses of pattern 307D will have traveled the longest distance through the pulse shaper 306. In one example, the sum of the four patterns will deliver a composite energy profile 312 with pulses that have duration $t_2$, which is longer than the duration $t_1$ of the initial pulse. The composite energy profile 312 will also have a lower average energy per unit time than the original pulse 307.

FIG. 3C illustrates a plot of the expected temperature profile of a surface region of a substrate exposed to pulse energy having the profile 312 as a function of time. It should be noted that depending on the transmission to reflection ratio of each of the selected splitters in the system, the energy of the sub-pulses may be adjusted to deliver a desired pulse profile. For example, by selecting a more transmissive, rather than reflective, combination of splitters the profile of the composite energy profile 312 will have a higher starting energy that will drop off towards the end of the composite profile pulse 312. It should be noted that while FIG. 3B illustrates rectangular shaped pulses that have the same amplitude this is not intended to be limiting as to the scope of the invention, since other pulse shapes may be used to deliver a composite energy profile 312 that has a more desirable profile.

Figure 3D:
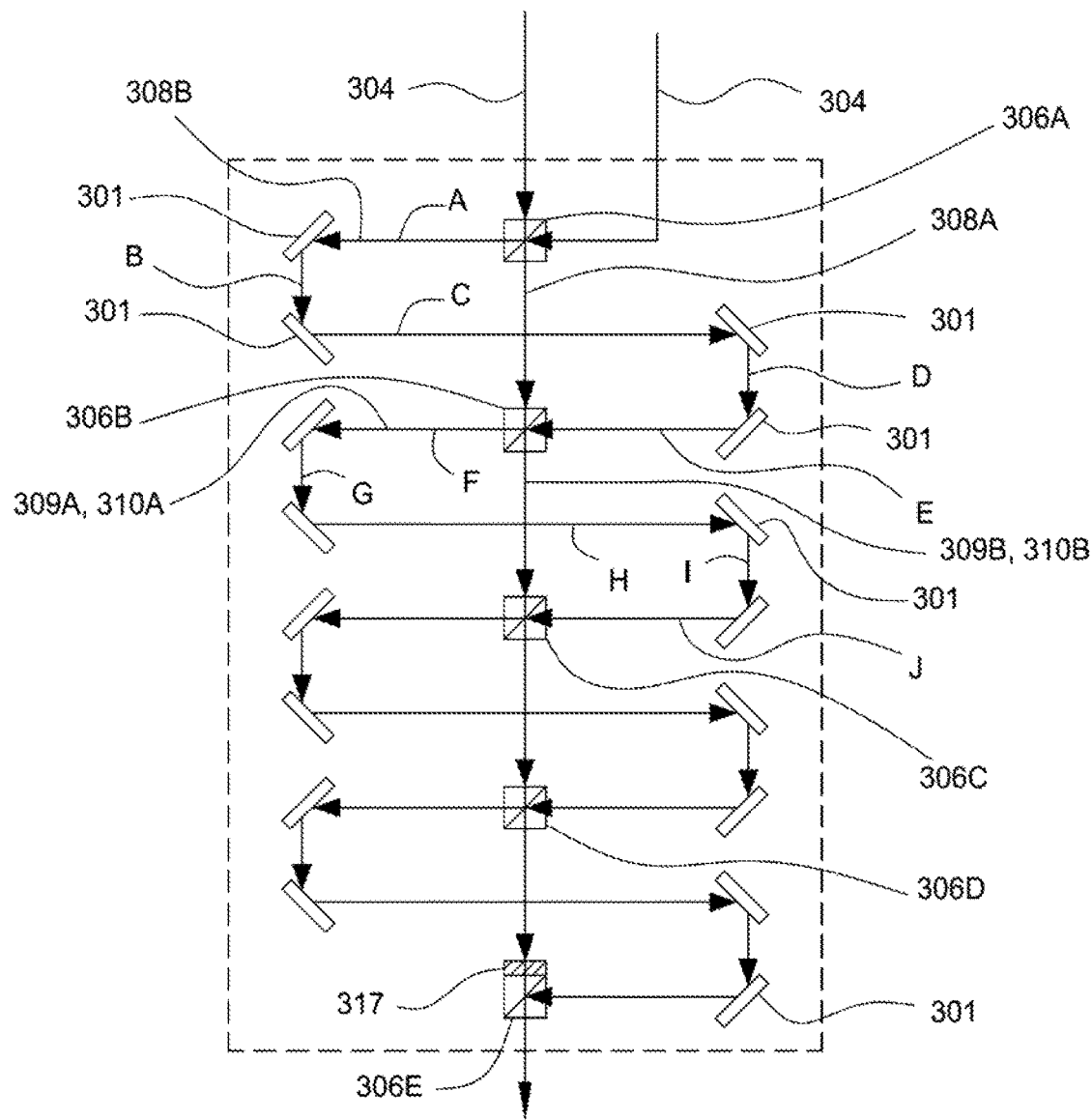
FIG. 3D is a schematic view of the pulse shaper of FIG. 3A according to another embodiment.
Figure 3E:
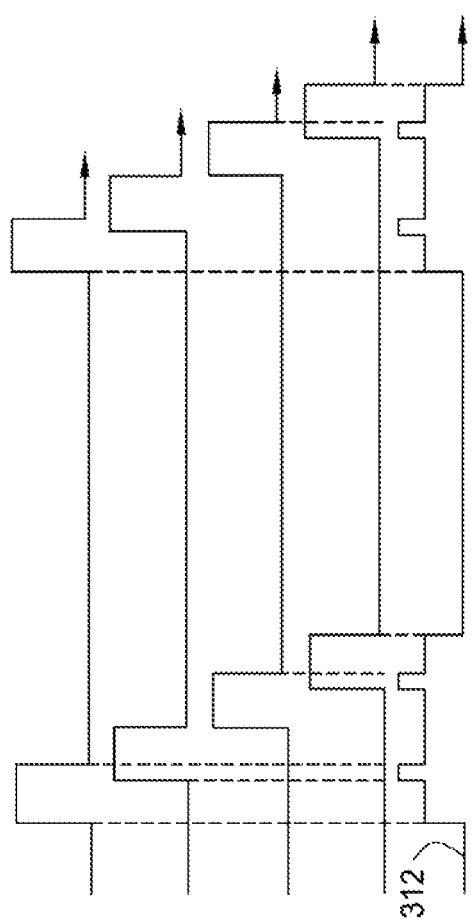
FIGS. 3E and 3F are graphs showing pulse timing and pulse energy profile using the pulse shaper of FIG. 3D.
Figure 3F:
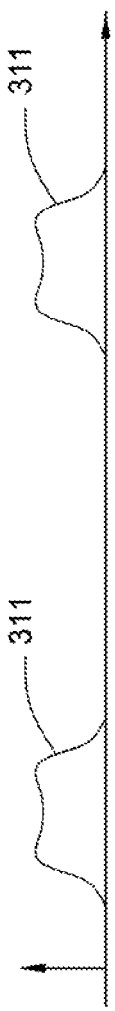

FIG. 3D schematically illustrates another embodiment of the present invention that is used to deliver a desirable pulse profile by utilizing two or more synchronized energy sources (e.g., laser sources 102A-D) with output routed through the pulse control module 106 and to pulse shaper 306, which are each discussed above in conjunction with FIGS. 1-3C. In this configuration, the controller 112 synchronizes the output of the laser sources 102A-D to form synchronized pulses 304 as input to the pulse shaper 306 so that composite pulses 312 emerging from the pulse shaper 306 will have a desirable profile. The composite pulse 312 may contain a composite of each of the sub-pulses created in the pulse stretcher assembly 306 for each of the synchronized pulses delivered from each of the laser sources 102A-D. The profile, or shape, of the composite pulse 312 shown in FIG. 3C formed from sub-pulses 307A-D is not intended to be limiting as to the scope of the invention since any pulse profile can be used to provide an optimized anneal process. Alternate composite pulse shapes may be realized by changing the synchronization of pulses, as illustrated in FIGS. 3E and 3F, which show a different synchronization of pulses and a different composite pulse shape 312 and temperature profile 311.

Figure 3G:
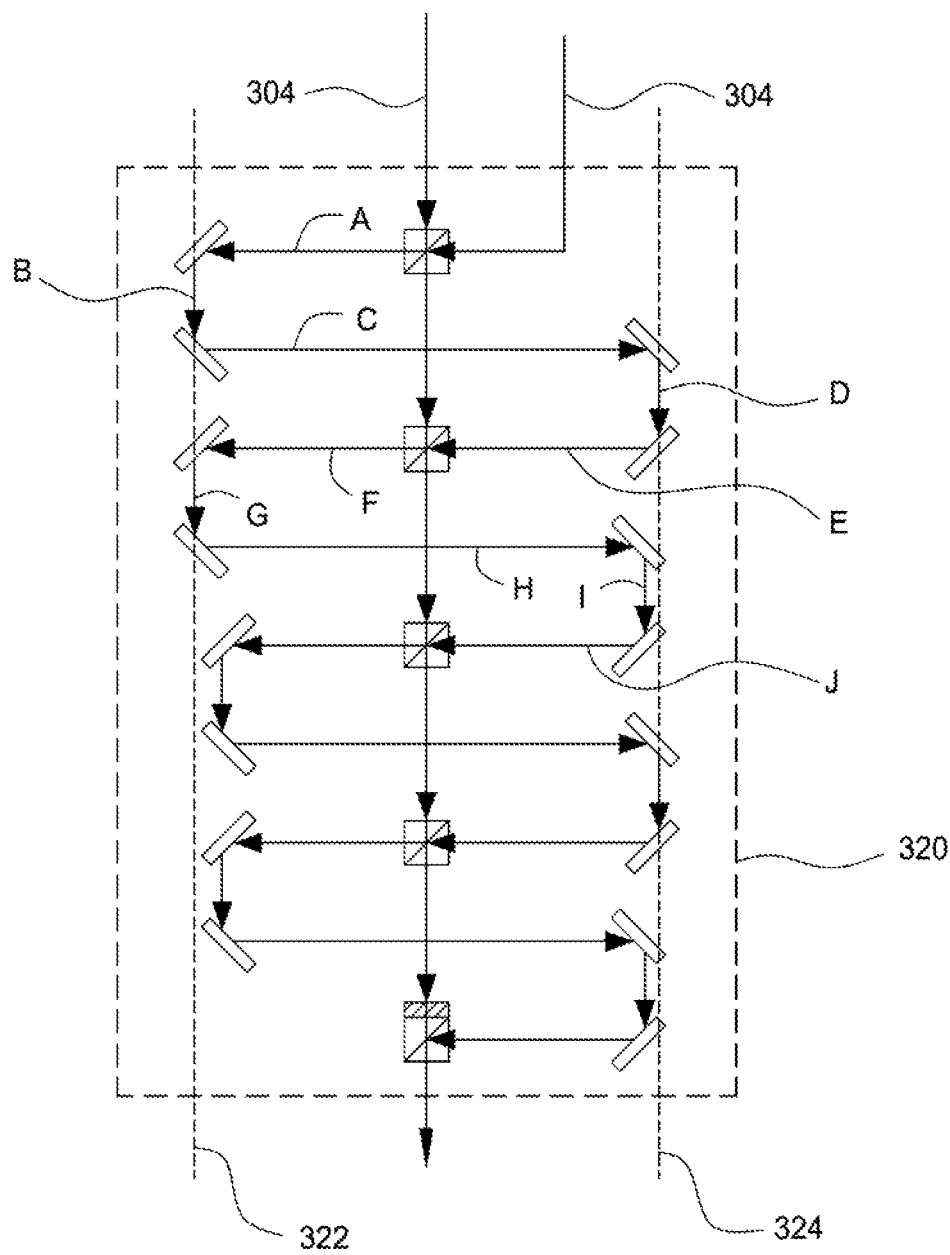
FIG. 3G is a schematic view of a pulse shaper according to another embodiment.

FIG. 3G schematically illustrates another embodiment of a pulse shaper 320 showing a further technique for pulse shaping. In the pulse shaper 320 of FIG. 3G, at least some of the reflectors are displaced from a datum 322 or 324 to vary the optical path of light through the pulse shaper 320. The displacement of a mirror may be set a desired distance "x" to achieve a certain temporal displacement for a sub-pulse. Typically the mirrors will be displaced in pairs, each mirror in a given mirror pair having a nearly identical displacement from the datum. The displacements of pairs of mirrors may naturally be different to achieve any desired pulse shape. In one embodiment, the displacement $x_1$ of a first mirror pair is about 10 mm, the displacement $x_2$ of a second mirror pair is about 7.5 mm, the displacement $x_3$ or a third mirror pair is about 20 mm, and the displacement $x_4$ of a fourth mirror pair is about 15 mm.

In another embodiment, all pulses emanating from a plurality of lasers may be directed into a pulse shaper without passing through a combiner first. Optics may be used to bring the pulses into close physical proximity such that they all strike the first splitter of the pulse shaper (e.g. 350A or 306A in FIGS. 3A and 3D). The pulses may be arranged in a configuration, for example a square configuration, having a dimension less than a cross-sectional dimension of the first splitter of the pulse shaper, such that the pulses all travel through the first splitter.

Figure 4A:
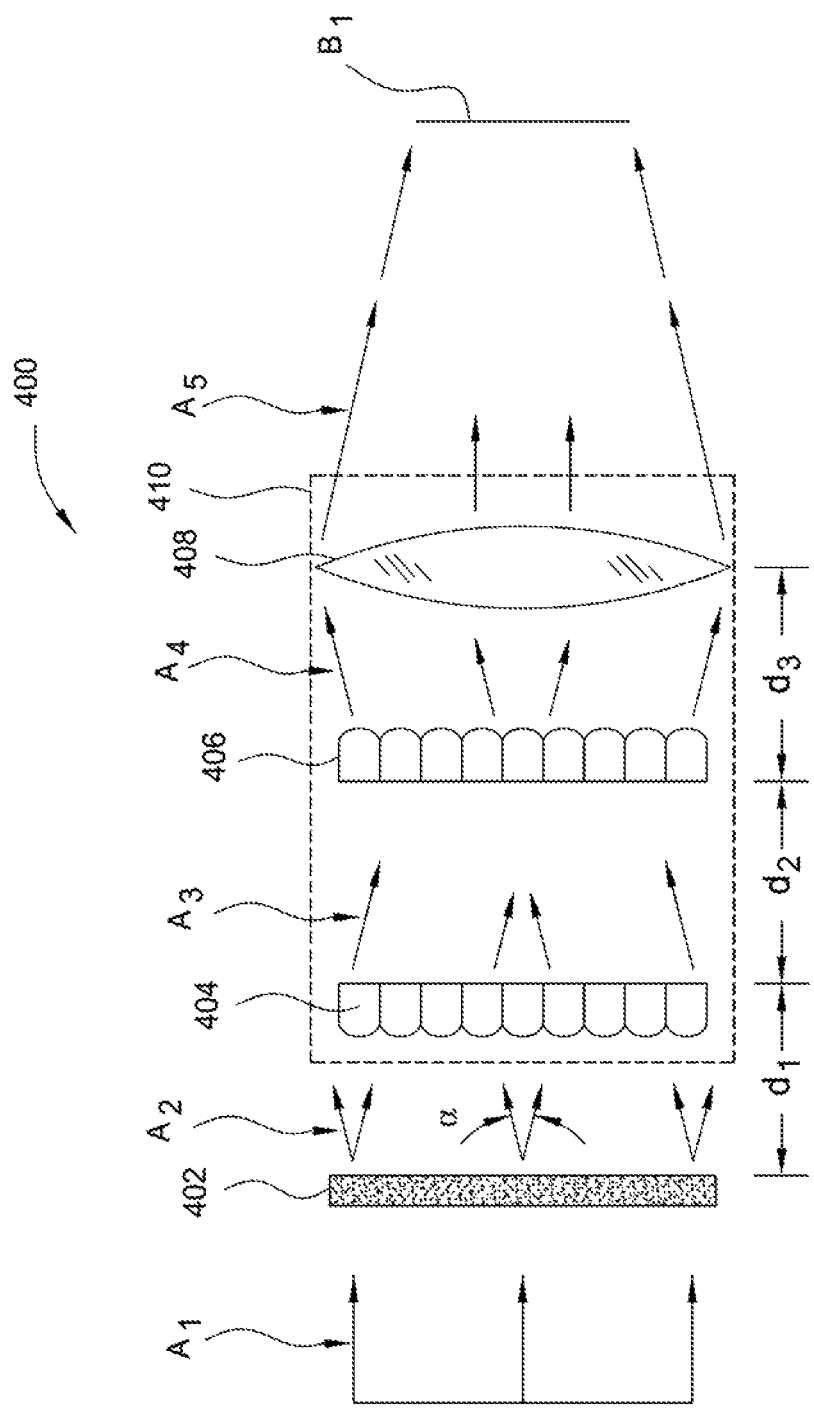
FIGS. 4A and 4B are schematic views of homogenizers according to two embodiments.

Shaped pulses from the pulse shaping module 106 are routed into a homogenizer 108. FIG. 4A is a schematic view of a homogenizer 400 according to one embodiment. The homogenizer 108 of FIG. 1 may be the homogenizer 400 of FIG. 4A. A beam integrator assembly 410 contains a pair of micro-lens arrays 404 and 406 and a lens 408 that homogenize the energy passing through this integrator assembly. It should be noted that the term micro-lens array, or fly's-eye lens, is generally meant to describe an integral lens array that contains multiple adjacent lenses. As designed, the beam integrator assembly 410 generally works best using an incoherent source or a broad partially coherent source whose spatial coherence length is much smaller than a single micro-lens array's dimensions. In short, the beam integrator assembly 410 homogenizes the beam by overlapping magnified images of the micro-lens arrays at a plane situated at the back focal plane of the lens 408. The lens 408 may be corrected to minimize aberrations including field distortion.

The size of the image field is a magnified version of the shape of the apertures of the first microlens array, where the magnification factor is given by $F/f_1$ where $f_1$ is the focal length of the microlenses in the first micro-lens array 404 and F is the focal length of lens 408. In one example, a lens 408 that has a focal length of about 175 mm and a micro-lenses in the micro-lens array have a 4.75 mm focal length is used to form an 11 mm square field image.

Although many different combinations for these components can be used, generally the most efficient homogenizers will have a first micro-lens array 404 and second micro-lens array 406 that are identical. The first micro-lens array 404 and a second micro-lens array 406 are typically spaced a distance apart so that the energy density (Watts/mm$^2$) delivered to the first micro-lens array 404 is increased, or focused, on the second micro-lens array 406. This can cause damage, however, to the second micro-lens array 406 when the energy density exceeds the damage threshold of the optical component and/or optical coating placed on the optical components. Typically the second micro-lens array 406 is spaced a distance $d_2$ from the first micro-lens array 404 equal to the focal length of the lenslets in the first micro-lens array 404.

In one example, each the micro-lens arrays 404, 406 contains 7921 micro-lenses (i.e., 89×89 array) that are a square shape and that have an edge length of about 300 microns. The lens 408, or Fourier lens, is generally used to integrate the image received from the micro-lens arrays 404, 406 and is spaced a distance $d_3$ from the second micro-lens array 406.

In applications where coherent or partially coherent sources are used, various interference and diffraction artifacts can be problematic when using a beam integrator assembly 410, since they create high intensity regions, or spots, within the projected beam's field of view, which can exceed the damage threshold of the various optical components. Therefore, due to the configuration of the lenses or the interference artifacts, the usable lifetime of the various optical components in the beam integrator assembly 410 and system has become a key design and manufacturing consideration.

A random diffuser 402 may be placed in front of or within the beam homogenizer assembly 400 so that the uniformity of outgoing energy $A_5$ is improved in relation to the incoming energy $A_1$. In this configuration, the incoming energy $A_1$ is diffused by the placement of a random diffuser 402 prior to the energy $A_2$, $A_3$ and $A_4$ being received and homogenized by the first micro-lens array 404, second micro-lens array 406 and lens 408, respectively. The random diffuser 402 will cause the pulse of incoming energy ($A_1$) to be distributed over a wider range of angles ($\alpha_1$) to reduce the contrast of the projected beam and thus improve the spatial uniformity of the pulse. The random diffuser 402 generally causes the light passing through it to spread out so that the irradiance (W/cm$^2$) of energy $A_3$ received by the second micro-lens array 406 is less than without the diffuser. The diffuser is also used to randomize the phase of the beam striking each micro-lens array. This additional random phase improves the spatial uniformity by spreading out the high intensity spots observed without the diffuser. In general, the random diffuser 402 is narrow angle optical diffuser that is selected so that it will not diffuse the received energy in a pulse at an angle greater than the acceptance angle of the lens that it is placed before.

In one example, the random diffuser 402 is selected so that the diffusion angle $\alpha_1$ is less than the acceptance angle of the micro-lenses in the first micro-lens array 404 or the second micro-lens array 406. In one embodiment, the random diffuser 402 comprises a single diffuser, such as a 0.5° to 5° diffuser that is placed prior to the first micro-lens array 404. In another embodiment, the random diffuser 402 comprises two or more diffuser plates, such as 0.5° to 5° diffuser plates that are spaced a desired distance apart to further spreading out and homogenize the projected energy of the pulse. In one embodiment, the random diffuser 402 may be spaced a distance $d_1$ away from the first micro-lens array 404 so that the first micro-lens array 404 can receive substantially all of the energy delivered in the incoming energy $A_1$.

Figure 4B:
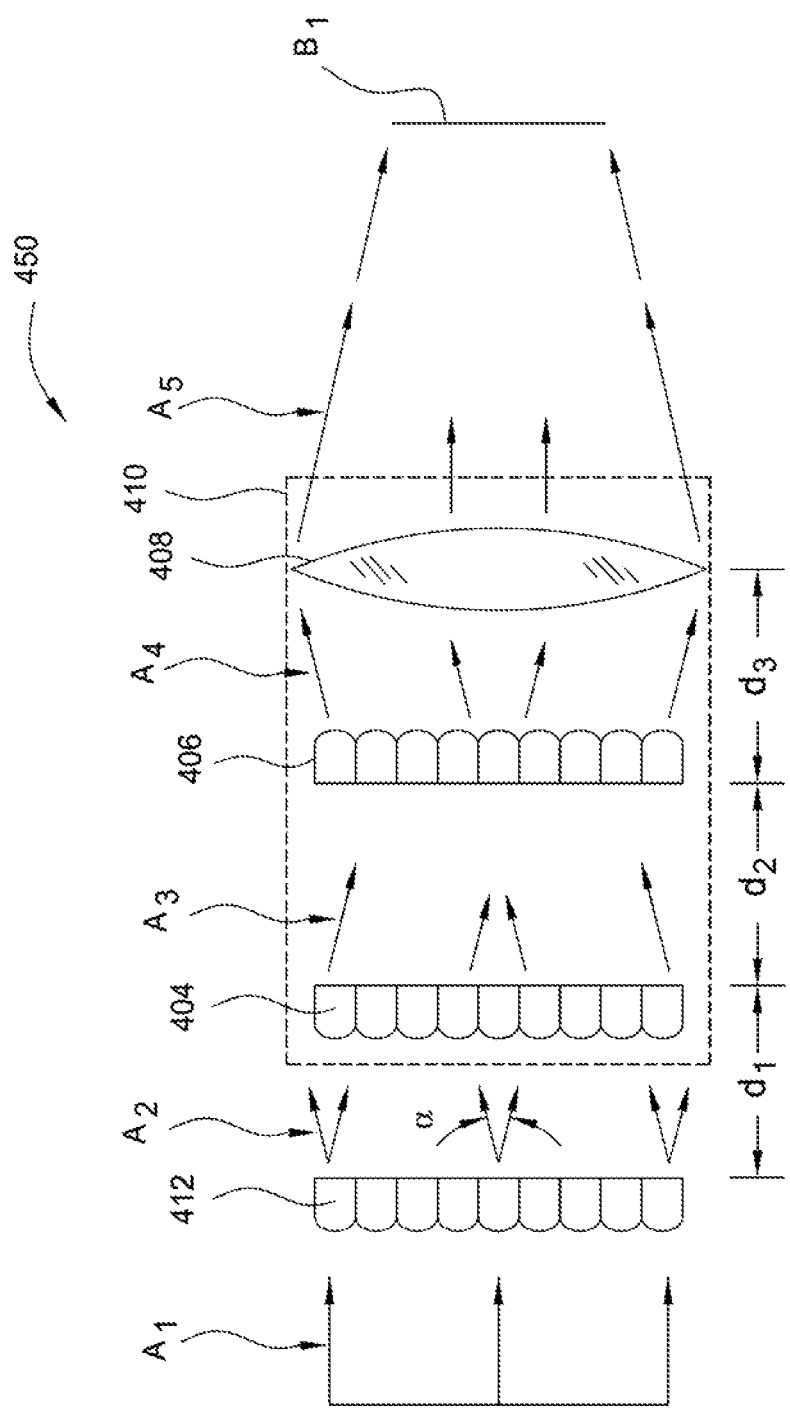

FIG. 4B is a schematic view of a homogenizer 450 according to another embodiment. The homogenizer 108 of FIG. 1 may be the homogenizer 450 of FIG. 4B. The homogenizer 450 is the same as the homogenizer 400, except in the following respects. Instead of using a random diffuser 402 to improve uniformity of the outgoing energy, a third microlens array 412 may be used.

Referring again to FIG. 1, energy from the homogenizer 108 is typically arranged in a pattern, such as a square or rectangular shape, that approximately fits an area to be annealed on the surface of a substrate. The processing and rearranging applied to the energy results in an energy field having intensity that varies from an average value by no more than about 15%, such as less than about 12%, for example less than about 8%. Random non-uniformities in intensity may be present throughout the energy field at various locations and are referred to hereinafter as the "speckle pattern." Near the edges of the energy field, however, more significant non-uniformities may persist due to various boundary conditions throughout the apparatus. These edge non-uniformities may be removed using an aperture member 116. The aperture member 116 is typically an opaque object having an opening through which the energy may pass in cross-section shaped like the opening.

FIG. 5 is a side view of an aperture member 500 according to one embodiment. The aperture member 116 of FIG. 1 may be the aperture member 500 of FIG. 5. The aperture member 500 has a first member 502 that is substantially transparent to selected forms of energy, such as light or laser radiation having a selected wavelength. An energy blocking member 504, which may be opaque or reflective, is formed over a portion of a surface of the first member 502 defining an opening 508 through which energy will pass in the shape of the opening 508. A second member 506 is disposed over the first member 502 and the energy blocking member 504, covering the opening 508. The second member 506 is also substantially transparent to the energy to be transmitted through the aperture member 500, and may be the same material as the first member 502. The edges of the aperture member 500 are enclosed by a covering 510 that ensures particulates do not enter the opening 508.

The aperture member 500 is positioned such that the energy blocking member 504 is at a focal plane 512 of the energy incident on the aperture member 500, ensuring a precise truncation of the energy field. Because the opening 508 is positioned at the focal plane of the energy, any particles that collect in the opening, for example on the surface of the first member 502, cast shadows in the transmitted energy field that lead to non-uniform processing of a substrate. Covering the opening 508 with the second member 506 and enclosing the edges of the aperture member 500 ensures that any particles adhering to the aperture member 500 are far enough from the focal plane to be out of focus in the final energy field so that variation in intensity of the final energy field due to the shadows of the particles is reduced.

The first and second members 502 and 506 are typically made from the same material, usually glass or quartz. The energy blocking member 504 may be an opaque or reflective material, such as metal, white paint, or a dielectric mirror. The energy blocking member 504 may be formed and shaped, and the formed and shaped energy blocking member 504 applied to the first member 502 using an appropriate adhesive, such as Canada balsam. Alternately, the energy blocking member 504 may be deposited on the first member 502 and then etched to provide the opening 508. The second member 506 is typically applied to the energy blocking member 504 using adhesive.

The covering 510 may be a material that is permeable or impermeable to gases. The covering may be an adhesive or a hard material applied using an adhesive. Alternately, the covering may be formed by melt-fusing the edges of the first and second members 502 and 506 with the edge of the energy blocking member 504.

To avoid refractive effects of the aperture member 500, the side walls of the opening 508, defined by an interior edge 514 of the energy blocking member 504, may be tapered, angled, or slanted to match the propagation direction of photons emerging from the homogenizer 108.

FIG. 5B is a side view of an aperture member 520 according to another embodiment. The aperture member 116 of FIG. 1 may be the aperture member 520 of FIG. 5B. The aperture member 520 is the same as the aperture member 500 of FIG. 5A, except that the aperture member 520 has no central opening 508. The aperture member 520 comprises a transmissive member 522 with the energy blocking member 504 embedded therein. Reducing the number of interfaces between different media in the aperture member 520 may reduce refractive effects. The interior edge 514 of the energy blocking member 504 is shown tapered in the embodiment of FIG. 5B, as described above in connection with FIG. 5A.

The aperture member 520 of FIG. 5B may be made by etching or grinding an annular shelf around a central dais of a first transmissive member, adhering an annular energy blocking member to the annular shelf, and then adhering a second transmissive member to the energy blocking member and the central dais of the first transmissive member, using an optically inactive adhesive such as Canada balsam. Alternately, the energy blocking member may be adhered to a first transmissive member having no central dais, and the second transmissive member formed by depositing a material over the energy blocking member and the exposed portion of the first transmissive member, filling the central opening with transmissive material. Deposition of transmissive materials is well-known in the art, and may be practiced using any known deposition or coating process.

Aperture members may vary in size. An aperture member having a smaller aperture may be positioned proximate an aperture member having a larger aperture to reduce the size of the transmitted energy field. The smaller aperture member may be removed again to utilize the larger aperture. Multiple aperture members having different sizes may be provided to allow changing the size of the energy field to anneal areas having different sizes. Alternately, a single aperture member may have a variable aperture size. Two rectangular channels may be formed in a transparent housing, and two pairs of opaque or reflective actuated half-plates disposed in the rectangular channels such that a pair of half-plates meets in a central portion of the transparent housing. The pairs of half-plates may be oriented to move along orthogonal axes so that a rectangular aperture of variable size may be formed by moving each pair of half-plates closer together or further apart within the rectangular channels.

The aperture members 500 and 520 may magnify or reduce the image of the light passing through the aperture in any desired way. The aperture members may have magnification factor of 1:1, which is essentially no magnification, or may reduce the image in size by a factor of between about 1.1:1 and about 5:1, for example, about 2:1 or about 4:1. Reduction in size may be useful for some embodiments because the edges of the imaged energy field may be sharpened by the size reduction. Magnification by a factor between about 1:1.1 and about 1:5, for example about 1:2, may be useful in some embodiments to improve efficiency and throughput by increasing coverage area of the imaged energy field.

The aperture members 500 and 520 may be movable within the system 100. The opening 508 of the aperture member 500 and the transmissive member 522 of the aperture member 520 are generally disposed at the focal plane 512 of the energy incident on the aperture members 500 and 520. The aperture members 500 and 520 may be movable along an X axis and a Y axis within the focal plane 512 (a Z axis, not shown, is perpendicular to the focal plane 512 and the X axis and Y axis (into or out from the page) are parallel to the focal plane 512). A motor 530 capable of moving the aperture members 500 and 520 along the X axis and Y axis within the focal plane 512 is coupled to the aperture members 500 and 520. The motor 530 may be an electric motor, such as a stepper motor or piezoelectric motor, that is capable of moving the aperture members 500 and 520 a predetermined distance along the X axis or Y axis, or combinations thereof, within the focal plane 512. The system 100 may further comprise an aperture controller 540 which controls the motor 530. The aperture controller 540 may be any controller capable of being programmed with a computer readable medium which may be configured to control the movement of the aperture members 500 and 520 via the motor 530. In certain embodiments, the aperture controller 540 may be communicatively coupled with the substrate support 110 and the controller 112.

In one embodiment, the aperture members 500 or 520 may be moved in a pattern, such as a grid pattern. The aperture members 500 or 520 may move, or step, in the X axis "m" steps wherein the step size may be from about 10 um to about 100 um. The aperture members 500 or 520 may move in the Y axis "n" steps wherein the step size may be from about 10 um to about 100 um. After the aperture members 500 or 520 have completed movement in the X axis and Y axis, light may be pulsed to the aperture members 500 or 520. Upon the pulse ending, the movement process may repeat until "m" steps of X and "n" steps of Y are completed. In the embodiment described above, "m" and "n" may be any number from 1 to 100, such as about 3 to 10. It is contemplated that the aperture members 500 and 520 may be moved in any combination of directions so as to capture different cross-sectional portions of the pulsed light. The aperture members 500 or 520 movement described herein may be synchronized with the substrate support 110 movement that will be discussed below. In certain embodiments, the step size of the aperture member 500 or 520 movement corresponds to the step size of the substrate support movement 110.

Figure 6:
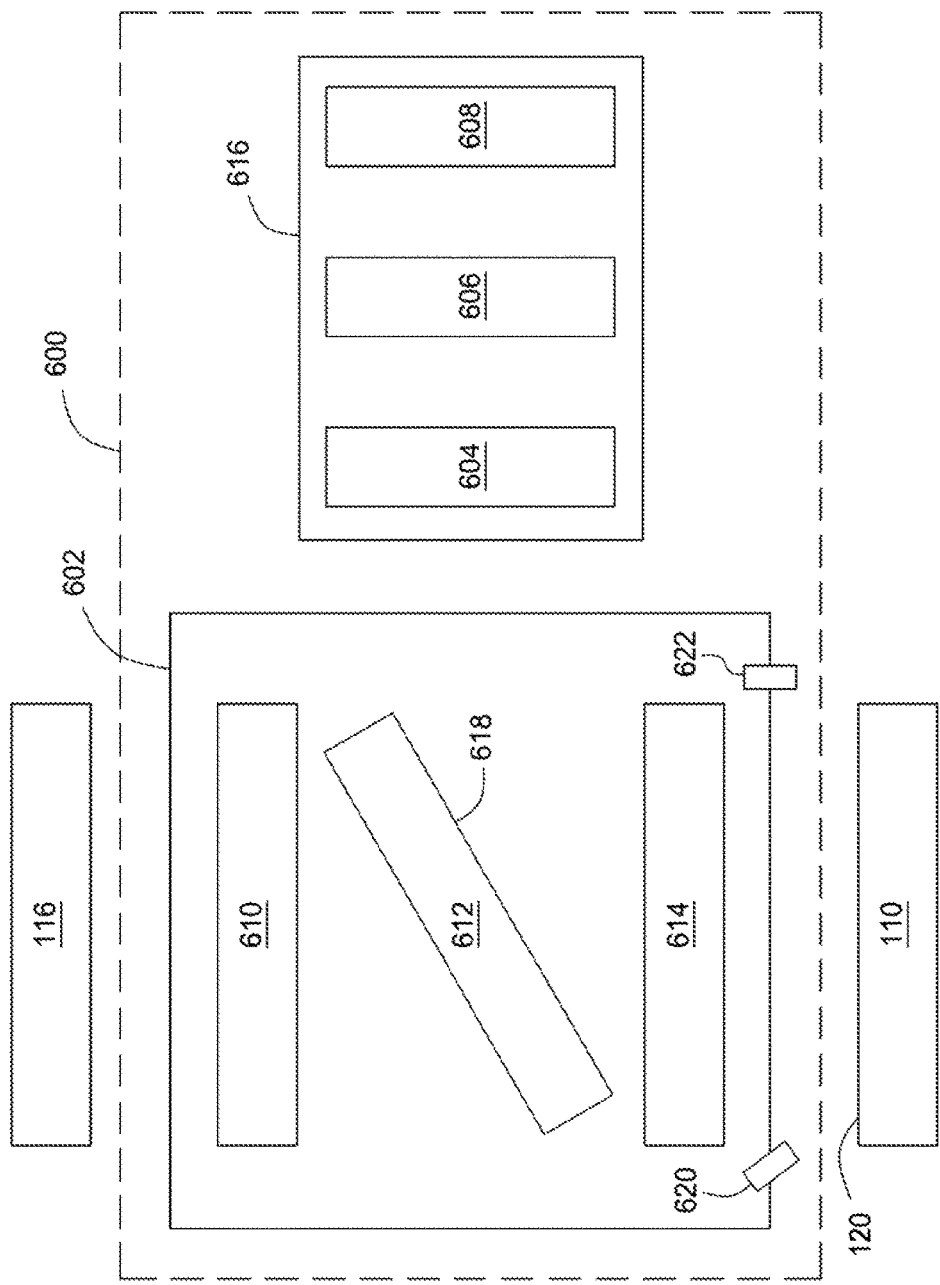
FIG. 6 is a schematic view of an imaging system according to another embodiment.

Referring again to FIG. 1, an imaging optic 118 receives the shaped, smoothed, and truncated energy field from the aperture member 116 and projects it onto a substrate disposed on a work surface 120 of the substrate support 110. FIG. 6 is a schematic view of an imaging system 600 according to one embodiment. The imaging system 118 of FIG. 1 may be the imaging system 600 of FIG. 6. The imaging system 118 has a transmitting module 602 and a detecting module 616. The transmitting module 602 has a first transmitting optic 610 and a second transmitting optic 614, with a sampling optic 612 disposed between the first and second transmitting optics 610 and 614.

The sampling optic 612 has a reflective surface 618 optically coupled to the substrate support and to the detecting module 616. Energy from the aperture member 116 enters the transmitting optic 602, passing through the first transmitting optic 610, the sampling optic 612, and the second transmitting optic 614 to illuminate a substrate disposed on the work surface 120 of the substrate support 110. Energy reflected from the substrate travels back through the second transmitting optic 614 and reflects from the reflective surface 620 of the sampling optic 612. The reflected energy is directed to the detecting optic 616.

The detecting optic 616 has a first steering optic 604, a second steering optic 606, and a detector 608. The first and second steering optics 604 and 606 are operable to position the energy field reflected from the substrate in a desired position on the detector 608. This allows imaging of various parts of the energy field at the detector 608 with increased precision. The detector 608 may be a photodiode array or a CCD matrix, allowing visualization of the energy field interacting with the substrate. Markers on the substrate may be viewed using the imaging system 600 to facilitate alignment of the energy field with desired structures on the substrate when the substrate is illuminated by the energy field. Alternately, a constant low-intensity ambient light source may be provided to facilitate viewing the substrate through the imaging system 600 when the substrate is not illuminated by the energy field. Venire adjustments may be made to the x, y, z, and θ positioning of the substrate based on observations using the imaging system 600 to achieve precise alignment and focus of the energy and the substrate for processing a first anneal region of the substrate. Subsequent positioning is then automatically performed by the substrate support 110 under direction of the controller 112.

Diagnostic instruments may be provided to indicate properties of a substrate during annealing. The imaging module 118 or 600 may have one or more temperature sensors 620 for indicating intensity of radiation emitted by the substrate as a function of temperature. A pyrometer may be used for such purposes. The imaging module 118 or 600 may also have one or more surface absorption monitor 622 for indicating a change in absorptivity of the substrate. By measuring an intensity of reflected light in the wavelengths used to anneal the substrate, the surface absorption monitor 622 signals a change in state from a more reflective state to a more absorptive state, and vice versa. A reflectometer may be used for such purposes. In some embodiments, providing two or more temperature sensors and two or more surface absorption monitors may allow comparison of two or more readings for improved accuracy.

While two diagnostic instruments 620 and 622 are shown in the imaging module 600 of FIG. 6, any number of diagnostic instruments may be disposed in a position to monitor condition of the substrate. In some embodiments, an acoustic detector or a photoacoustic detector, or both, may be disposed to detect acoustic effects of annealing energy on a substrate. Acoustic response from the substrate may be used to indicate a change in state of the substrate material, such as a phase change. In one embodiment, a listening device may detect melting of a portion of the substrate.

Thermal energy is coupled into a substrate disposed on a work surface 120 of a substrate support 110 using methods disclosed herein. The thermal energy is developed by applying electromagnetic energy at an average intensity between about 0.2 J/cm$^2$ and about 1.0 J/cm$^2$ to successive portions of the surface of a substrate in short pulses of duration between about 1 nsec and about 100 nsec, such as between about 5 nsec and about 50 nsec, for example about 10 nsec. A plurality of such pulses may be applied to each portion of the substrate, with a duration between the pulses between about 500 nsec and about 1 msec, such as between about 1 μsec and about 500 μsec, for example about 100 μsec, to allow complete dissipation of the thermal energy through the substrate before the next pulse arrives. The energy field typically covers an area of between about 0.1 cm$^2$ and about 10.0 cm$^2$, for example about 6 cm$^2$, resulting in a power delivery of between about 0.2 MW and about 10 GW with each pulse. In most applications, the power delivered with each pulse will be between about 10 MW and about 500 MW. The power density delivered is typically between about 2 MW/cm$^2$ and about 1 GW/cm$^2$, such as between about 5 MW/cm$^2$ and about 100 MW/cm$^2$, for example about 10 MW/cm$^2$. The energy field applied in each pulse has spatial standard deviation of intensity that is no more than about 4%, such as less than about 3.5%, for example less than about 3.0%, of the average intensity.

Delivery of the high power and uniformity energy field mostly desired for annealing of substrates may be accomplished using an energy source 102 with a plurality of lasers emitting radiation readily absorbed by the substrate to be annealed. In one aspect, laser radiation having a wavelength of about 532 nm is used, based on a plurality of frequency-doubled Nd:YAG lasers. Four such lasers having individual power output about 50 MW may be used together for suitable annealing of a silicon substrate.

Pulses of energy may be formed by interrupting generation or propagation of a beam of energy. A beam of energy may be interrupted by disposing a fast shutter across an optical path of the beam. The shutter may be an LCD cell capable of changing from transparent to reflective in 10 nsec or less on application of a voltage. The shutter may also be a rotating perforated plate wherein size and spacing of the perforations are coupled with a selected rate of rotation to transmit energy pulses having a chosen duration through the openings. Such a device may be attached to the energy source itself or spaced apart from the energy source. An active or passive q-switch, or a gain switch may be used. A Pockels cell may also be positioned proximate to a laser to form pulses by interrupting a beam of laser light emitted by the laser. Multiple pulse generators may be coupled to an energy source to form periodic sequences of pulses having different durations, if desired. For example, a q-switch may be applied to a laser source and a rotating shutter having a periodicity similar to that of the q-switch may be positioned across the optical path of the pulses generated by the q-switched laser to form a periodic pattern of pulses having different durations.

Self-correlation of the pulses is reduced by increasing the number of spatial and temporal modes of the pulses. Correlation, either spatial or temporal, is the extent to which different photons are related in phase. If two photons of the same wavelength are propagating through space in the same direction and their electric field vectors point the same direction at the same time, those photons are temporally correlated, regardless of their spatial relationship. If the two photons (or their electric field vectors) are located at the same point in a plane perpendicular to the direction of propagation, those two photons are spatially correlated, regardless of any temporal phase relationship.

Correlation is related to coherence, and the terms are used almost interchangeably. Correlation of photons gives rise to interference patterns that reduce uniformity of the energy field. Coherence length is defined as a distance beyond which coherence or correlation, spatial or temporal, falls below some threshold value.

Photons in pulses can be temporally decorrelated by splitting a pulse into a number of sub-pulses using a succession of splitters, and routing each sub-pulse along a different path with a different optical path length, such that the difference between any two optical path lengths is greater than a coherence length of the original pulse. This largely ensures that initially correlated photons likely have different phase after the different path lengths due to the natural decline in coherence with distance travelled. For example, Nd:YAG lasers and Ti:sapphire lasers typically generate pulses having a coherence length of the order of a few millimeters. Dividing such pulses and sending parts of each pulse along paths having length differences more than a few millimeters will result in temporal decorrelation. Sending sub-pulses along multi-reflective paths with different lengths is one technique that may be used. Sending sub-pulses along multi-refractive paths with different effective lengths defined by different refractive indices is another technique. The pulse shaping modules described in connection with FIGS. 3A, 3D, and 3G may be used for temporal decorrelation of pulses.

Spatial decorrelation may be achieved by creating an energy field from a pulse and overlapping portions of the energy field. For example, portions of an energy field may be separately imaged onto the same area to form a spatially decorrelated image. This largely ensures that any initially correlated photons are spatially separated. In one example, a square energy field may be divided into a checkerboard-style 8×8 sampling of square portions, and each square portion imaged onto a field the same size as the original energy field such that all the images overlap. A higher number of overlapping images decorrelates the energy more, resulting in a more uniform image. The homogenizers 400 and 450 of FIGS. 4A and 4B may be useful in spatially decorrelating pulses.

A laser pulse imaged after the decorrelation operations described above generally has a cross-section with a uniform energy intensity. Depending on the exact embodiment, the cross-sectional energy intensity of a pulsed energy field treated according to the above processes may have a standard deviation of about 3.0% or less, such as about 2.7% or less, for example about 2.5%. As described above, the energy intensity varies across the pulsed energy field resulting in the speckle pattern. An edge region of the energy field will exhibit a decaying energy intensity that may decay by 1/e along a dimension that is less than about 10% of a dimension of the energy field, such as less than about 5% of the dimension of the energy field, for example less than about 1% of the energy field. The edge region may be truncated using an aperture, such as the aperture members 500 and 520 of FIGS. 5A and 5B, or may be allowed to illuminate a substrate outside a treatment zone, for example in a kurf space between device areas on a substrate.

If the energy field is truncated, an aperture member is typically positioned across the optical path of the pulses to trim the non-uniform edge regions. To achieve clean truncation of the image, the aperture is located near a focal plane of the energy field. Refractive effects of the aperture interior edge may be minimized by tapering the aperture interior edge to match a direction of propagation of photons in the pulse. Multiple removable aperture members having different aperture sizes and shapes may be used to change the size and/or shape of the aperture by inserting or removing the aperture member having the desired size and/or shape. Alternately, a variable aperture member may be used.

An energy field may be directed toward a portion of a substrate to anneal the substrate. The energy field may be aligned, if desired, with structures such as alignment marks on the substrate surface by viewing the substrate surface along the optical path of the energy field. Reflected light from the substrate may be captured and directed toward a viewing device, such as a camera or CCD matrix. A reflecting surface, such as a one-way mirror, as in the imaging system 600 of FIG. 6, may be disposed along the optical path of the energy field to capture the reflected light.

Thermal state of the substrate may be monitored by viewing radiation emitted, reflected, or transmitted by the substrate during processing. Radiation emitted by the substrate indicates temperature of the substrate. Radiation reflected or transmitted by the substrate indicates the absorptivity of the substrate, which in turn signals a change in the physical structure of the substrate from a reflective to an absorptive state and vice versa. Accuracy of the signals from such devices may be improved by comparing the results using multiple devices.

Referring back to FIG. 1, the substrate support 110 has a work surface 120 upon which a substrate may be disposed. A substrate disposed on the work surface 120 of the substrate support 110 generally contains features which are exposed to energy which is provided from the system 100. Energy, such as laser light, is provided through the imaging optic 118 towards the substrate support 100.

Figure 7A:
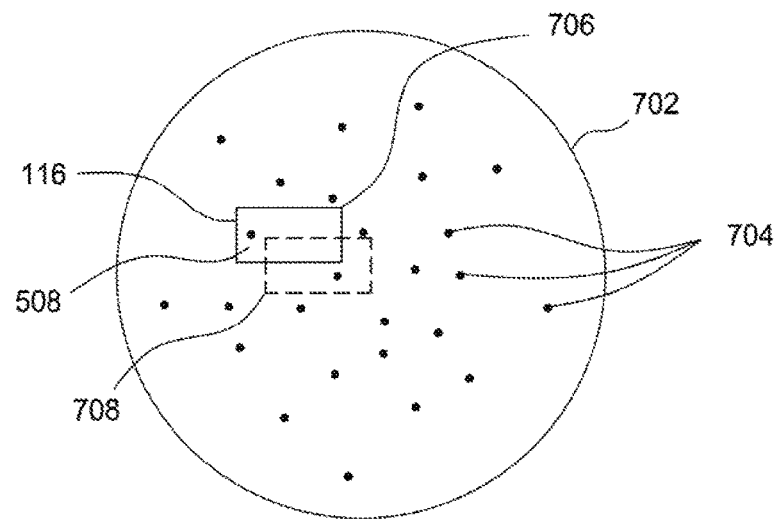
FIG. 7A is a schematic drawing of an energy field with an aperture member capturing a portion of an energy field.

FIG. 7A is a schematic drawing of an energy field 702 with an aperture member 116, such as aperture member 500, having an opening 508 (or the aperture member 520 having the transmissive region 522 depending upon which aperture member described in the above embodiments) capturing a portion of the energy field 702. The energy field 702, such as laser light with a generally uniform cross sectional energy distribution, has some degree of non-uniformity as described above and which is schematically represented by the speckle pattern 704. The aperture member 116 body (not shown) truncates all light from the energy field 702 not propagating through the opening 508. The opening 508 of the aperture member 116 selects a portion, or image, of the energy field 702 which will propagate through the imaging optic 118 to a substrate disposed on the work surface 120 of the substrate support 110.

The aperture member 116 may be disposed at a first position 706 such that the opening 508 captures a first image of the energy field 702 during a first laser pulse. After the first laser pulse has terminated, the aperture member 116 is then moved by the aperture motor 530 (See FIG. 5A/B) to a second position 708. A second laser pulse is provided and the opening 508 of the aperture member 116 captures a second image of the energy field 702.

Figure 7B:
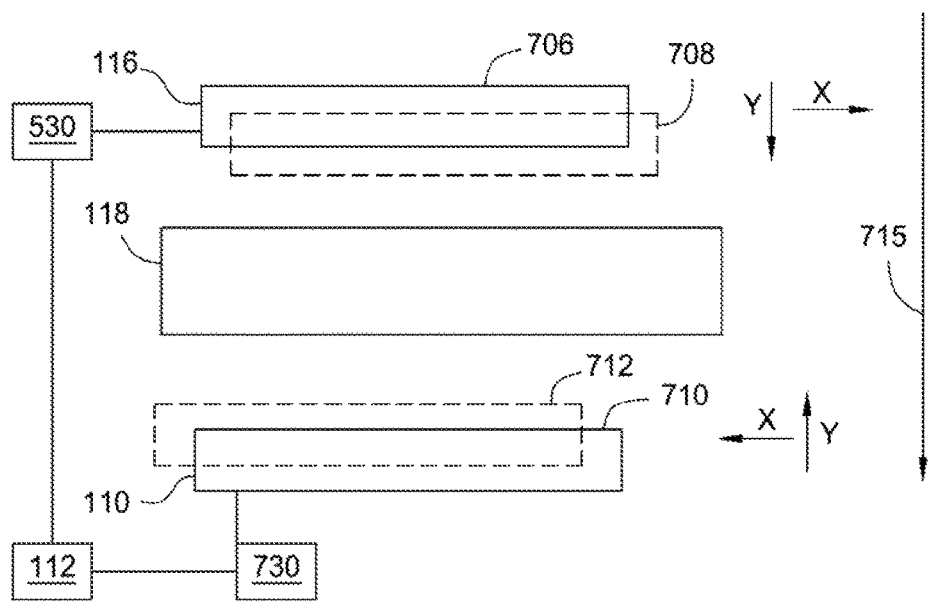
FIG. 7B is a schematic depicting a relationship of movement between an aperture member and a substrate support.

FIG. 7B is a schematic depicting a relationship of movement between the aperture member 116 and the substrate support 110. The aperture member 116, imaging optics 118, and substrate support 110 are provided in the optical path 715 of the energy field 702. The aperture motor 530 and a substrate support motor 730 are provided to move the aperture 116 and substrate support 110 respectively, along the X axis and Y axis which are each perpendicular to the optical path 715 of the energy field 702. The X axis and Y axis are parallel to the focal plane 512 (See FIG. 5A/B), as such, the movement along the X axis and Y axis may be horizontal within the focal plane 512. As described above, the aperture member 116 may be moved to capture different images of the energy field 702 for subsequent pulses of laser light. In a related embodiment, the substrate support 110 is moved in a manner that corresponds to the movement of the aperture member 116. The aperture member 116 disposed at a first position 706 captures a first image of the energy field 702 during a first laser pulse. The aperture member 116 may then be moved to a second position 708 to capture a second image of the energy field 702 before a second pulse of laser light is provided. The movement of the aperture member is effectuated by the aperture motor 530 which is coupled to the aperture member 116 and communicatively coupled to the controller 112. All movement of the aperture member 116 is typically performed within the focal plane 512 (parallel to the focal plane 512) perpendicular to the optical path 715 of the energy field 702. As such, movement is made along the X axis, Y axis, or combinations thereof to capture different images of the energy field 702. The image created by the aperture member 116 passes through the imaging optics 118 before the image is available at a substrate disposed on the substrate support 110.

In one embodiment, the substrate support 110 is moved at the same time as the aperture member 116 between pulses of laser light. The substrate support 110 may be moved in directions opposite the movement of the aperture member 116 to account for image displacement via the imaging optics 118. The movement of the substrate support 110 is effectuated by the substrate support motor 730, which may be a stepper motor or piezoelectric motor, which provides movement along the X axis and Y axis, or combinations thereof, which are perpendicular to the optical path 715 of the energy field 702. The substrate support motor 730 may be communicatively coupled to the controller 112 which may synchronize the movement of the aperture member 116 and the substrate support 110 via signals provided to the aperture motor 530 and the substrate support motor 730.

In the embodiment shown in FIG. 7B, the aperture member is provided at a first position 706. The aperture motor 530 may receive a signal from the controller 112 which causes the aperture 116 to move a first distance in the Y direction. The aperture motor 530 may also receive a signal from the controller 112 which causes the aperture 116 to move a second distance in the X direction. It is contemplated that the movement in the X and Y directions may be performed simultaneously, concurrently, or sequentially. In this embodiment, the substrate support 110 moves in a manner that corresponds to the movement of the aperture member 116 so that substantially the same area of the substrate may be illuminated by a pulse passing through the imaging optics 118. The substrate support motor 730 may receive a signal from the controller which causes the substrate support 110 to move a first distance in the Y direction which is opposite the direction moved by the aperture member 116. The substrate support motor 730 may then receive a signal from the controller 112 which causes the substrate support 110 to move a second distance in the X direction which is opposite the direction moved by the aperture member 116. The distances moved by the substrate support 110 may be equal to the distances moved by the aperture member 116, and may be in opposite directions if the imaging optics 118 have an image reversing property. The movement of the aperture member 116 results in the aperture member 116 at a second position 708. The movement of the substrate support 110 results in the substrate support 110 at a second position 710. It is contemplated that all movement of the aperture member 116 and the substrate support 110 is typically performed between laser pulses. As such, the aperture member 116 and substrate support 110 are usually stationary during each laser pulse. It should be noted, however, that the aperture member 116 and substrate support 110 may be moved during application of a single pulse, if desired.

Although the aperture member 116 and the substrate support 110 may move in opposite directions, the movement is typically coordinated such that the same area on the substrate is exposed to the image. It is contemplated that the substrate may be exposed to multiple laser pulses, such as between about 1 to about 100,000 laser pulses, such as between about 1 to about 100 laser pulses, such as about 50 laser pulses. The same area of the substrate is exposed to the image, which may contain a different portion of the energy field 702 from successive pulses. Capturing different portions of the energy field also captures different portions of the speckle pattern which exists in the energy field 702. Imaging different portions of the speckle pattern on the same area of the substrate further reduces processing non-uniformity at the substrate by illuminating each area of the substrate with a plurality of different random intensity patterns. It is also contemplated that various other elements within the system 100 may be altered and/or moved to change the speckle pattern to further increase uniformity of the energy field 702 at the substrate. For example, various optical elements of the homogenizer 108 may be altered and/or moved to change the speckle pattern.

Figure 8:
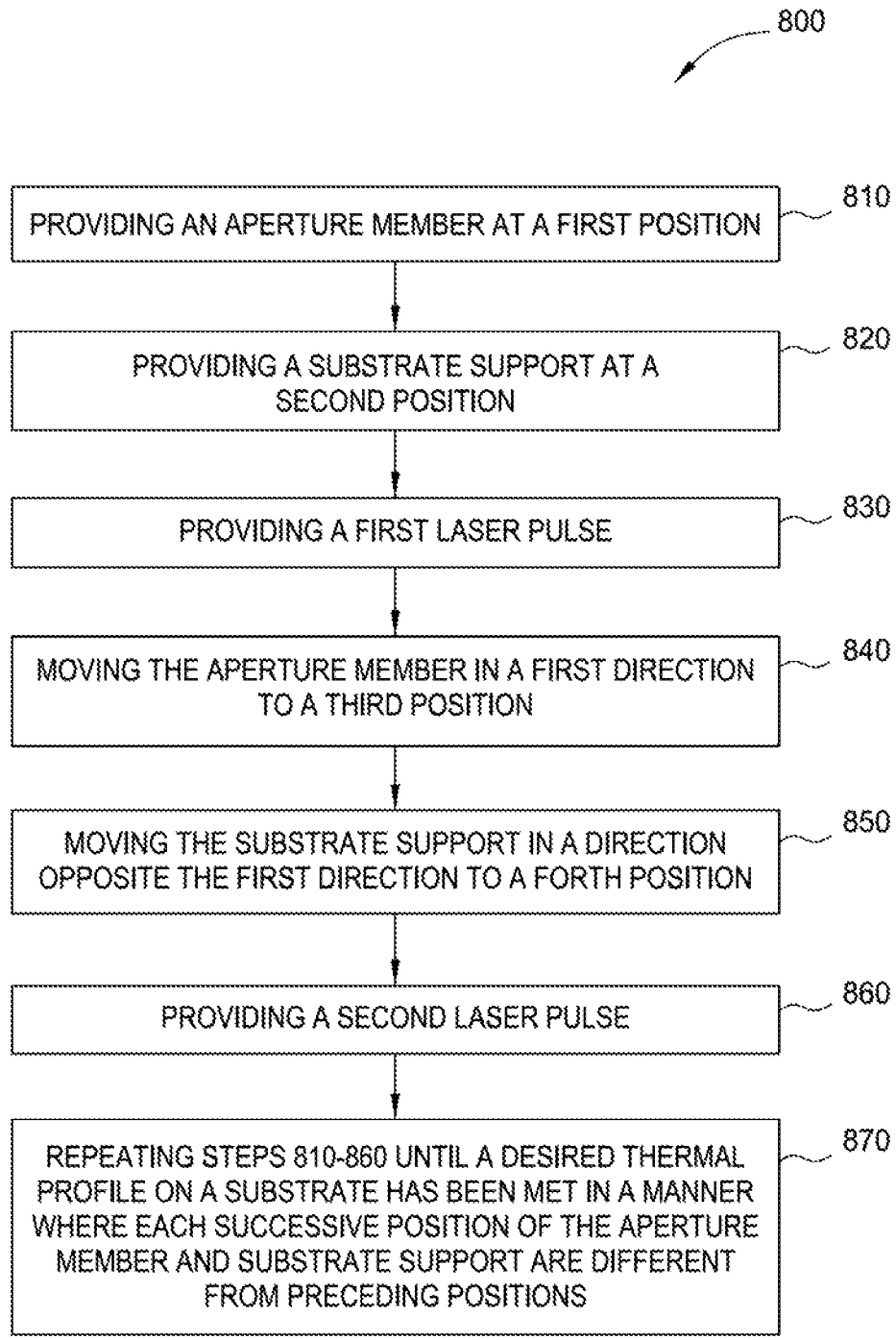
FIG. 8 depicts method steps of thermally processing a substrate.

FIG. 8 depicts a method 800 of thermally processing a substrate. The method 800 may be performed using the apparatuses described herein. The method 800 operates at operation 810 by providing an aperture member at a first position. The aperture member at the first position captures an image of an energy field which will be imaged on a substrate to perform thermal processing on the substrate. The image captured by the aperture member in the first position may capture a first portion of a speckle pattern or another non-uniformity pattern on the energy field. At operation 820, a substrate support is provided at a first position. The first position of the substrate support corresponds to the first position of the aperture member. A first laser pulse is provided at operation 830. The laser pulse intensity, duration, and coherency may be determined by the apparatus described above in connection with FIGS. 1-4.

After the first laser pulse has terminated, the aperture member may be moved in a first direction to a second position at operation 840. The substrate support may be moved in a direction opposite the first direction of the aperture member to a second position at operation 850. It is contemplated that the movement of the aperture member and the substrate support may be performed sequentially, concurrently, or simultaneously. The substrate support may be moved in a direction opposite the movement of the aperture member to account for the displacement of the image through an imaging optics if the imaging optic has an image reversing property. Then, a second laser pulse is provided at operation 860. The image captured by the aperture member in the second position captures a different portion of the energy field and speckle pattern. The substrate support in the second position ensures the same area of the substrate is exposed to the image of the second laser pulse as was exposed to the image of the first laser pulse. Operation 870 provides for repeating operations 810-860 until a desired thermal profile on the substrate has been achieved. If operations 810-860 are repeated, one embodiment provides that each successive position of the aperture member and substrate support are different from each preceding position. Different positions allow for different portions of the energy field and speckle pattern to be imaged on the same area of the substrate which reduces non-uniformity of the energy field at the substrate. As a result, more predictable and improved annealing characteristics may be realized.

A thermal processing apparatus may have a source of electromagnetic energy operable to produce pulses of electromagnetic energy, an optical system comprising a pulse combiner, a pulse shaper, a homogenizer, and an aperture member positioned to receive pulses of electromagnetic energy from the source, a substrate support operable to move a substrate with respect to the optical system, and an imaging system operable to view the substrate along an optical path of the optical system.

An apparatus for combining pulses of electromagnetic energy may have a first energy input, a second energy input, a first optic for imparting a first property to the first energy, a second optic for imparting a second property to the second energy, a selecting surface that reflects or transmits energy based on the first property and the second property, a steering optic for steering the first energy to a first location on a first side of the selecting surface and the second energy to a second location on a second side of the selecting surface opposite the first side of the selecting surface, wherein the first location and the second location are aligned, and a diagnostic module optically coupled to the selecting surface.

A thermal processing system may have a plurality of laser energy sources, each having an active q-switch coupled to an electronic timer, at least two combiners optically coupled to the laser energy sources, each combiner having a selecting optic, the selecting optic having a selecting surface, an optical system to direct light from the laser energy sources to opposite sides of the selecting surface, and a homogenizer comprising at least three microlens arrays.

A substrate processing system may have a source of electromagnetic energy, an optical system for focusing the electromagnetic energy, and an aperture member having a reflective portion embedded therein, the reflective portion having an opening through which the electromagnetic energy projects, a surface of the reflective portion positioned at a focal plane of the electromagnetic energy.

A substrate may be processed by directing a field of electromagnetic energy toward a portion of the substrate, the field of electromagnetic energy comprising light from a plurality of lasers that has been combined by passing through two sides of a selecting surface of a combining optic, temporally decorrelated, spatially decorrelated, and passed through a reflector optically coupled to the substrate.

A substrate may also be processed by directing a field of electromagnetic energy toward a portion of the substrate, the field comprising pulsed light from two or more lasers, detecting a temporal shape of the field using a photodiode, detecting an energy content of the field using a pyroelectric detector, adjusting a pulse timing of one or more of the lasers based on the temporal shape detected by the photodiode, and attenuating one or more of the lasers based on the energy content of the field detected by the pyroelectric detector.

A substrate may also be processed by forming an energy field having a spatial standard deviation of intensity non-uniformity no more than about 3% and an energy content of at least about 0.2 J/cm$^2$ by combining polarized light from two or more lasers and decorrelating the light temporally and spatially, directing the energy field toward a first portion of the substrate surface in a pulse, moving the substrate, and directing the energy field toward a second portion of the substrate surface.

A substrate may also be processed by directing a shaped field of electromagnetic energy toward the substrate through a reflector optically coupled to the substrate, detecting an alignment of the substrate and the energy field by viewing light reflected from the substrate using the reflector, and adjusting the alignment of the substrate with the energy field.

While the foregoing is directed to embodiments of the present invention, other and further embodiments of the invention may be devised without departing from the basic scope thereof, and the scope thereof is determined by the claims that follow.

The invention claimed is:

1. A thermal processing apparatus, comprising:
   a laser source;
   a controller;
   a motor coupled to the controller; and
   an aperture member disposed at a focal plane of energy emitted from the laser source, wherein the aperture member is coupled to the motor, the aperture member comprising:
      a transmissive portion which is substantially transparent to the energy emitted from the laser source; and
      a non-transmissive portion which is substantially non-transmissive to the energy emitted from the laser source and is disposed with the transmissive portion substantially at the focal plane, wherein the non-transmissive portion is disposed between opposite sides of the transmissive portion along the optical axis.

2. The apparatus of claim 1, wherein the transmissive portion has an opening that is substantially coplanar with the non-transmissive portion.

3. The apparatus of claim 2, wherein the opening has a volume defined by the transmissive portion and the non-transmissive portion.

4. The apparatus of claim 1, wherein the transmissive portion comprises a quartz or glass material.

5. The apparatus of claim 1, wherein the non-transmissive portion is formed from an opaque material or a reflective material.

6. The apparatus of claim 5, wherein the non-transmissive portion is formed from a reflective metallic material.

7. The apparatus of claim 5, wherein the non-transmissive portion is a dielectric mirror.

8. The apparatus of claim 5, wherein an interior surface of the non-transmissive portion is angled.

9. The apparatus of claim 1, further comprising:
   a side member disposed radially outward of the transmissive portion and the non-transmissive portion.

10. The apparatus of claim 9, wherein the transmissive portion, the non-transmissive portion, and the side member are coupled by a substantially transparent adhesive.

11. The apparatus of claim 10, wherein the substantially transparent adhesive is Canada balsam.

12. The apparatus of claim 1, wherein the aperture member is moveable relative to the focal plane.

13. The apparatus of claim 9, wherein the side member is an adhesive material.

14. The apparatus of claim 13, wherein the adhesive material is impermeable to gas.

15. A thermal processing apparatus, comprising:
   a laser source;
   a controller;
   a motor coupled to the controller; and
   an aperture member coupled to the motor, the aperture member moveably disposed at a focal plane of energy emitted from the laser source, the aperture member comprising:
      a transmissive portion having a first portion and a second portion, both of which are substantially transparent to the energy emitted from the laser source, the transmissive portion defining a volume between the first and second portions at the focal plane;
      a non-transmissive portion which is substantially non-transmissive to the energy emitted from the laser source and is disposed between the first portion and the second portion substantially at the focal plane; and
      a side member disposed radially outward of the transmissive portion and the non-transmissive portion, wherein the non-transmissive portion is disposed between opposite sides of the transmissive portion along the optical axis.

16. A thermal processing apparatus, comprising:
   a laser source;
   a controller;
   a motor coupled to the controller; and
   an aperture member coupled to the motor, the aperture member disposed at a focal plane of energy emitted from the laser source, the aperture member comprising:
      a transmissive portion which is substantially transparent to the energy emitted from the laser source, the transmissive portion comprising a single portion having an annular shelf formed therein;
      a non-transmissive portion which is substantially non-transmissive to the energy emitted from the laser source and is disposed within the annular shelf substantially at the focal plane; and
      a side member coupled to the transmissive portion and the non-transmissive portion, wherein the non-transmissive portion is disposed between opposite sides of the transmissive portion along the optical axis.

17. The apparatus of claim 16, wherein the transmissive portion comprises a quartz or glass material.

18. The apparatus of claim 1, wherein the non-transmissive portion is formed from an opaque material or a reflective material.

* * * * *